(12) United States Patent
Bibl et al.

(10) Patent No.: US 12,131,922 B1
(45) Date of Patent: **\*Oct. 29, 2024**

(54) MICRO DEVICE MASS TRANSFER TOOL

(71) Applicant: Apple Inc., Cupertino, CA (US)

(72) Inventors: Andreas Bibl, Los Altos, CA (US); John A. Higginson, Santa Clara, CA (US); Patrick J. Czarnota, Milpitas, CA (US); Paul A. Parks, Austin, TX (US); Nile A. Light, Livermore, CA (US)

(73) Assignee: Apple Inc., Cupertino, CA (US)

( * ) Notice: Subject to any disclaimer, the term of this patent is extended or adjusted under 35 U.S.C. 154(b) by 1030 days.

This patent is subject to a terminal disclaimer.

(21) Appl. No.: 17/089,585

(22) Filed: Nov. 4, 2020

Related U.S. Application Data

(60) Provisional application No. 62/933,941, filed on Nov. 11, 2019, provisional application No. 62/933,928, filed on Nov. 11, 2019.

(51) Int. Cl.
| | | |
|---|---|---|
| *H01L 21/68* | (2006.01) | |
| *B65G 47/90* | (2006.01) | |
| *H01L 21/67* | (2006.01) | |
| *H01L 21/683* | (2006.01) | |
| *B25J 7/00* | (2006.01) | |
| *B25J 9/00* | (2006.01) | |
| *B25J 15/00* | (2006.01) | |

(52) U.S. Cl.
CPC ........ *H01L 21/67144* (2013.01); *B65G 47/90* (2013.01); *H01L 21/68* (2013.01); *H01L 21/681* (2013.01); *H01L 21/6831* (2013.01); *B25J 7/00* (2013.01); *B25J 9/0015* (2013.01); *B25J 15/0085* (2013.01)

(58) Field of Classification Search
CPC ......... H01L 21/681; B25J 7/00; B25J 9/0015; B25J 15/0085
See application file for complete search history.

(56) References Cited

U.S. PATENT DOCUMENTS

| | | | |
|---|---|---|---|
| 9,162,880 | B2 | 10/2015 | Higginson et al. |
| 9,296,111 | B2 | 3/2016 | Bibl et al. |
| 9,522,468 | B2 | 12/2016 | Parks et al. |
| (Continued) | | | |

OTHER PUBLICATIONS

Unipulse, "Differential Fiber-Optic Displacement Sensor", ATW200, received from https://www.unipulse.tokyo/en/product/atw200-2/, published Apr. 2017, 6 pgs.

(Continued)

*Primary Examiner* — Gerald McClain
(74) *Attorney, Agent, or Firm* — Aikin & Gallant, LLP

(57) ABSTRACT

A micro device transfer tool and methods of operation in which the micro device transfer tool includes an articulating transfer head assembly capable of six degrees of motion. A miniatured camera assembly may be secured near the point of contact for the articulating transfer head assembly to aid in system alignment. In an embodiment, an encoder system is included for alignment of a micro pick up array and target substrate using complementary concentric grating patterns. In an embodiment a miniaturized position sensor design is included for sensing position of various system components during alignment or pick and place processes.

15 Claims, 26 Drawing Sheets

(56) References Cited

U.S. PATENT DOCUMENTS

| | | |
|---|---|---|
| 10,183,401 B2 | 1/2019 | Higginson et al. |
| 10,814,496 B2 * | 10/2020 | Bibl ........................ H01L 21/68 |
| 11,480,742 B1 * | 10/2022 | Czarnota .............. G02B 6/4206 |
| 2003/0184765 A1 | 10/2003 | Gumny |
| 2006/0119304 A1 * | 6/2006 | Farritor .................. A61B 34/72 |
| | | 318/568.12 |
| 2010/0044441 A1 | 2/2010 | Cohen et al. |
| 2014/0071580 A1 | 3/2014 | Higginson et al. |
| 2016/0001450 A1 | 1/2016 | Higginson et al. |
| 2016/0161293 A1 | 6/2016 | Anthony et al. |
| 2017/0015006 A1 | 1/2017 | Higginson et al. |
| 2018/0194014 A1 * | 7/2018 | Bibl .................. H01L 21/67721 |

OTHER PUBLICATIONS

Suganuma et al., "Development of A Differential Optical-fiber Displacement Sensor", vol. 38, No. 7, Published Mar. 1, 1999, pp. 1103-1109.

* cited by examiner

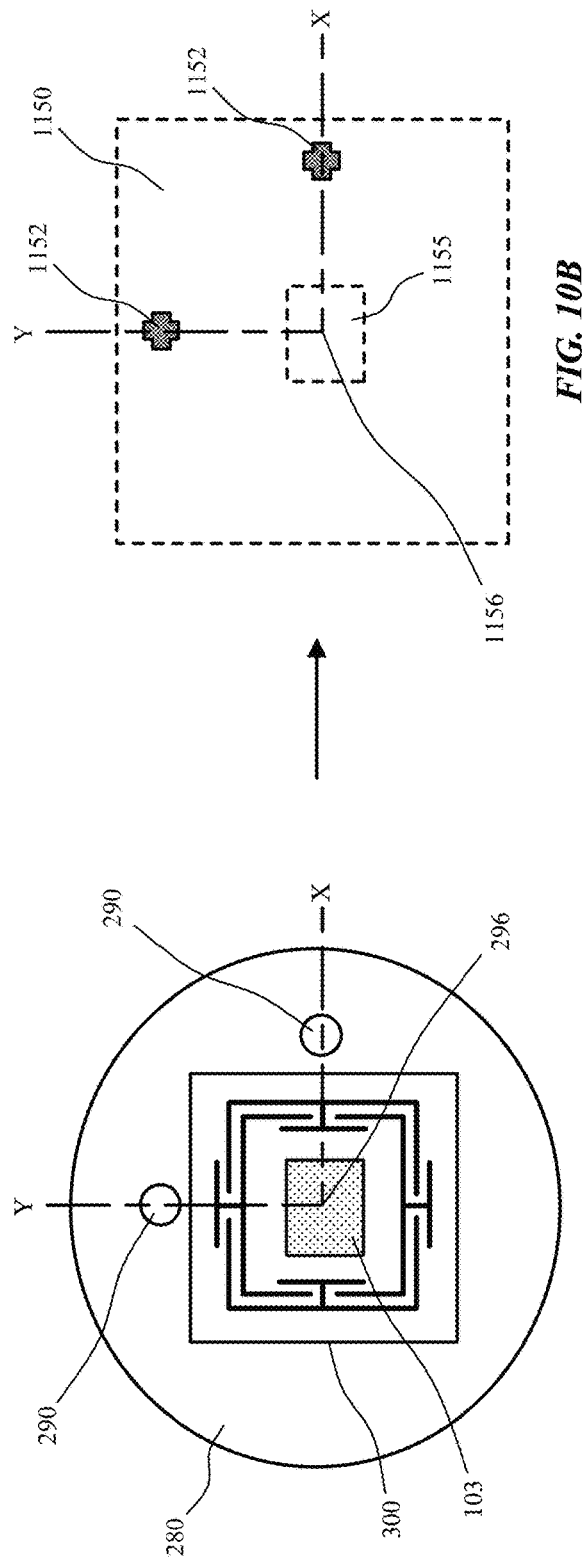
FIG. 10A
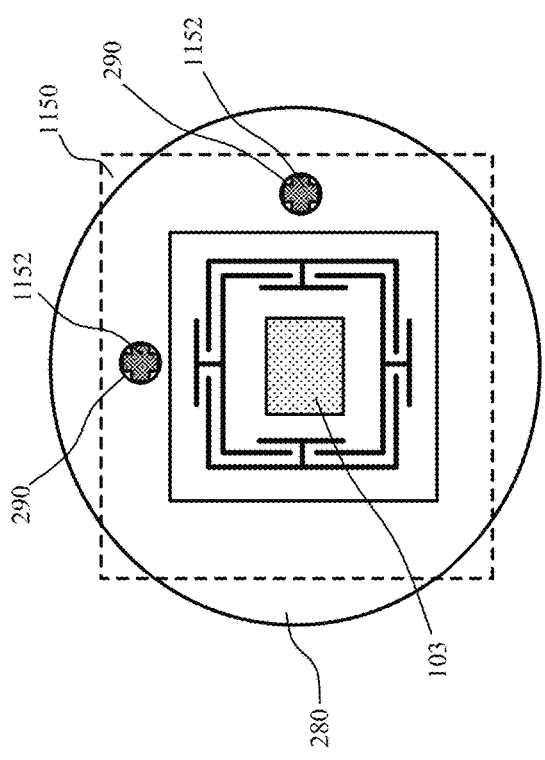
FIG. 10B
FIG. 10C

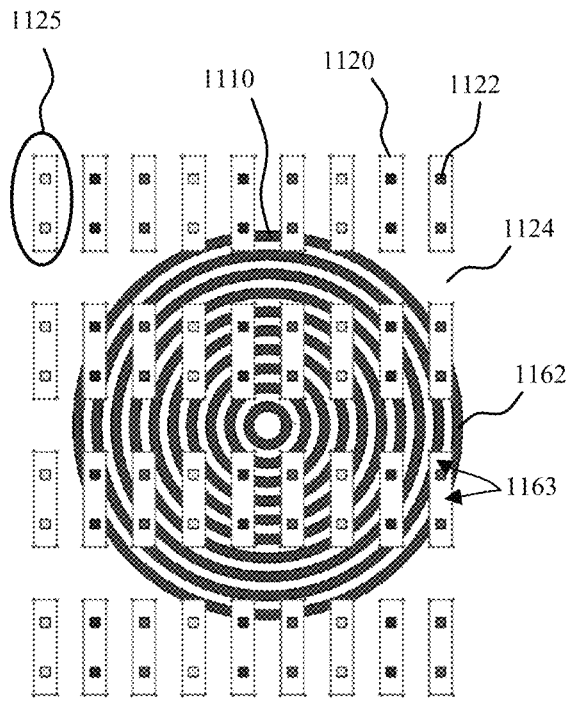 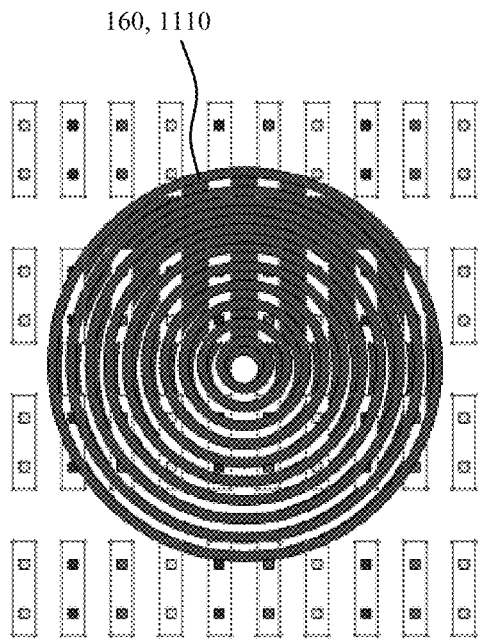
FIG. 16A  FIG. 16B
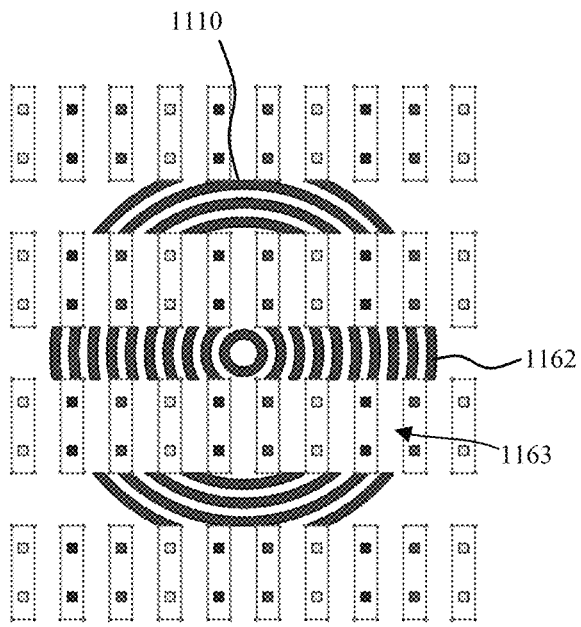 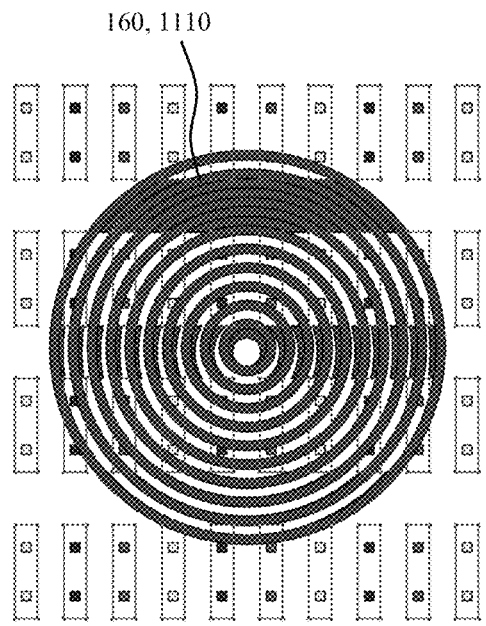
FIG. 17A  FIG. 17B

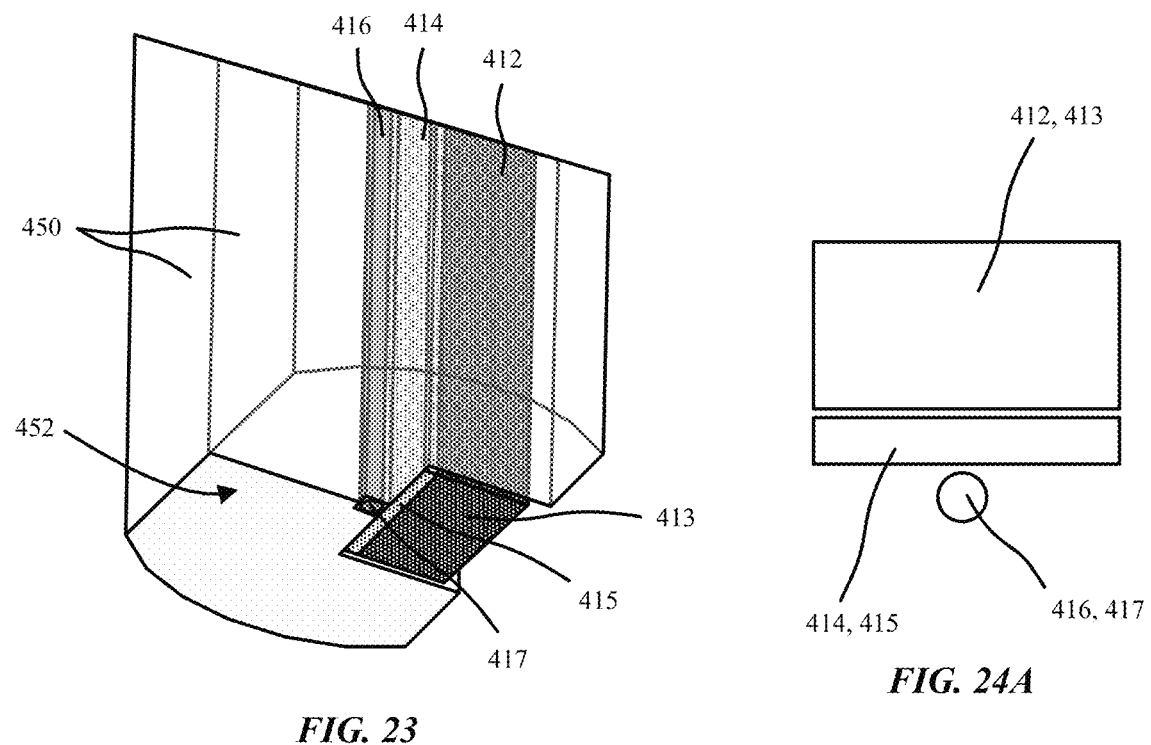
FIG. 23
FIG. 24A
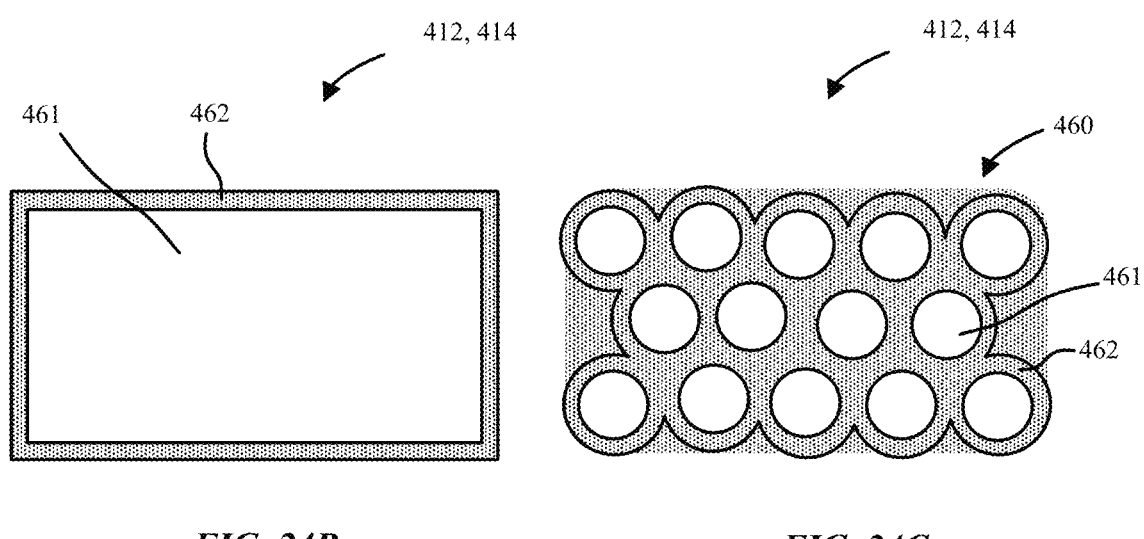
FIG. 24B
FIG. 24C

MICRO DEVICE MASS TRANSFER TOOL

RELATED APPLICATIONS

This application claims the benefit of priority from U.S. Provisional Patent Application Ser. No. 62/933,928 filed on Nov. 11, 2019 and U.S. Provisional Patent Application Ser. No. 62/933,941 filed on Nov. 11, 2019, the full disclosures of which are incorporated herein by reference.

BACKGROUND

Field

Embodiments described herein relate to systems and methods of micro device transfer, and related integrated sensor assemblies.

Background Information

Integration and packaging issues are one of the main obstacles for the commercialization of micro devices such as radio frequency (RF) microelectromechanical systems (MEMS) microswitches, light-emitting diodes (LEDs), and MEMS or quartz-based oscillators.

Traditional technologies for transferring of devices such as "direct printing" and "transfer printing" include transfer by wafer bonding from a transfer wafer to a receiving wafer. In both traditional and variations of the direct printing and transfer printing technologies, the transfer wafer is de-bonded from a device after bonding the device to the receiving wafer. In addition, the entire transfer wafer with the array of devices is involved in the transfer process.

In one process variation a transfer tool including an array of electrostatic transfer heads is used to pick up and transfer an array of micro devices from a carrier (donor) substrate to a receiving substrate. In such an implementation, the transfer heads operate in accordance with principles of electrostatic grippers, using the attraction of opposite charges to pick up the micro devices.

SUMMARY

Embodiments describe micro device transfer tools and subassemblies thereof to assist in alignment, including miniaturized cameras, encoder patterns of concentric gratings, and miniaturized position sensors. In an embodiment, a micro device transfer tool includes a carrier substrate holder, a receiving substrate holder, and an articulating transfer head assembly that is translatable along an x-translation direction between the carrier substrate holder and the receiving substrate holder. The articulating transfer head assembly may include a mounting plate and a camera pointing away from a bottom surface of the mounting plate. For example, the mounting plate may be used to secure a replaceable micro pick up array including an array of transfer heads used for the transfer of arrays of micro devices. In an embodiment, the camera is offset in a first direction relative to a center of the mounting plate. A second camera may also point away from the bottom surface of the mounting plate, and be offset in a second direction relative to the center of the mounting plate. In this manner, the miniaturized camera(s) may be located laterally adjacent to the MPA, and in the same frame of reference which allows for a more accurate system alignment with reduced thermal drift and geometric error. In a particular configuration, the first direction is parallel to the x-translation direction between the carrier substrate holder and the receiving substrate holder, and the second direction is orthogonal to the x-translation direction between the carrier substrate holder and the receiving substrate holder.

In an embodiment a micro device transfer tool includes a tip-tilt assembly, a piezoelectric stage assembly mounted underneath the tip-tilt assembly, a mounting plate underneath the piezoelectric stage assembly, and a camera mounted within the piezoelectric stage assembly and extending through an opening in a bottom surface of the mounting plate. The opening may be off-centered in the mounting plate as described above, for example in the first direction. In an embodiment, the camera is mounted in a z-flexure assembly of the piezoelectric stage assembly. For example, the piezoelectric stage assembly can include a plurality of stages nested inside one another, such as an x-stage assembly, a y-stage assembly, a $\theta z$ stage (rotation) assembly.

A center-opening may also be formed trough a center of the mounting plate, and a kinetic sensor assembly may be mounted over the center-opening. For example, the kinetic sensor may be a position sensor to measure the position of a pivot mount assembly that is releasably attachable with the mounting plate such that the pivot mount assembly spans underneath the center-opening. In an embodiment, an exterior-most lens of the camera is located less than one inch (e.g. laterally) from a center of center-opening. In one implementation, the camera has a working distance of greater than 500 µm. An exterior-most lens of the camera may be less than 5 mm in diameter. Thus, the camera may be considered a miniaturized camera designed to focus in the same frame of reference of a micro pick up array held by the pivot mount assembly. The camera is optionally mounted on a z-adjustment stage, which can be motorized and independently movable relative to the piezoelectric stage assembly. The tip-tilt assembly, piezoelectric stage assembly, mounting plate, camera, etc. may be part of an articulating transfer head assembly that is translatable between a carrier substrate holder and a receiving substrate holder. In an embodiment, the camera is offset in a direction relative to a center of the mounting plate parallel to an x-translation direction between the carrier substrate holder and the receiving substrate holder. A second camera may also be mounted within the piezoelectric stage assembly and extend through a second opening in the bottom surface of the mounting plate, where the second camera is offset in a second direction relative to the center of the mounting plate orthogonal to the x-translation direction between the carrier substrate holder and the receiving substrate holder.

Either of the first or second cameras, or both can be used to align the micro device transfer tool with a target location. In an embodiment, an alignment method includes translating an articulating transfer head assembly over a place area of a target substrate. For example, the articulating transfer head assembly may include a micro pick up array (MPA) including an array of transfer heads, a first camera offset from a center of the MPA in a first direction and pointing away from the MPA, a second camera offset from the center of the MPA in a second direction, and pointing away from the MPA. At least one of the cameras can then be aligned with one or more alignment features of the target substrate, which in turn can align the array of transfer heads with a target array of placement locations (or pick up locations) on the target substrate. For example, where the target substrate is a donor substrate this method can be used to align the MPA with micro devices to be picked up. Where the target substrate is a receiving substrate, this method can be used to align the MPA with target locations to place an array of micro devices held by the array of transfer heads.

In accordance with embodiment, the alignment method may include translating the articulating transfer head assembly along an x-translation direction to the target substrate. Thus, the alignment method can be in-situ during a transfer process. In a particular implementation the first direction of the first camera offset is parallel to the x-translation direction, and the second direction of the second camera offset is orthogonal to the x-translation direction. In operation, aligning the at least one of the cameras with the one or more alignment features of the target substrate can include aligning the first camera with a corresponding first alignment feature while the second camera is not aligned with a corresponding alignment feature. For example, this may potentially occur near an edge of the placement area. In this manner, the x-y offset cameras can compensate for the one another when there is no available space for a corresponding alignment feature on the target substrate.

Alignment can also be achieved using encoder patterns. In an embodiment, micro device transfer tool alignment method includes translating a first concentric grating pattern coupled with a first substrate (e.g. MPA including an array of transfer heads) over a second concentric grating pattern coupled with a second substrate (e.g. target substrate such as donor substrate or display substrate), directing a light through the first concentric grating pattern toward the second concentric grating pattern, detecting reflected light with a detector array divided into multiple detection zones, and determining a relative x-y position of the first and second substrates. The alignment method may further include comparing intensity of light in each zone, and determining the relative x-y position based on the intensity of light in each zone. In an embodiment, the first concentric grating pattern includes a plurality of rings of first diameters, and the second concentric grating pattern includes a plurality of rings of second diameters offset from the first diameters. Where the second substrate is a display substrate, the second concentric grating pattern may optionally be superimposed over a plurality of subpixels on the display substrate.

The concentric circles on the second substrate may be permanent features. In an embodiment, a display includes a display substrate including a pixel area and a non-pixel area, a plurality of concentric grating patterns on the display substrate. In an embodiment, the plurality of concentric grating patterns is located in the non-pixel area. In an embodiment, the plurality of concentric grating patterns is superimposed over a plurality of subpixels in the pixel area. For example, the plurality of concentric grating patterns can be patterned to include a plurality of line openings directly over light emitting diode landing areas in the plurality of subpixels.

The various subassemblies and alignment methods described can be used for x-y spatial alignment as wells as alignment of level surfaces. For example, position sensors are described which may include various structuring features that can mitigate drift, including rigid light guides to mitigate drift due to flexing, and packaging considerations such as photodiodes being mounted on opposite sides of a circuit board to mitigate thermal drift. Furthermore, the rigid light guides and packaging solutions facilitate a miniaturized assembly that can be easily integrated in a variety of locations of the micro device transfer tool.

In an embodiment, a position sensor includes a light source, a light source light guide including a light source light guide proximal end adjacent the light source and a light source light guide distal end adjacent a guide tip, a first photodiode, a first rigid light guide including a first rigid light guide proximal end adjacent the first photodiode and a first rigid light guide distal end adjacent the guide tip, a second photodiode, and a second rigid light guide including a second rigid light guide proximal end adjacent the second photodiode and a second rigid light guide distal end adjacent the guide tip. In an embodiment, the first rigid light guide includes a single first core and a first cladding surrounding the single first core, and the second rigid light guide includes a single second core and a second cladding surrounding the single second core. In an embodiment, the first rigid light guide includes a first fiber bundle, and the second rigid light guide includes a second fiber bundle. In an embodiment, the first rigid light guide distal end is located laterally between the light source light guide distal end and the second rigid light guide distal end. The first rigid light guide distal end may have a smaller area than the second rigid light guide distal end in some configurations.

In an embodiment, the first photodiode and the second photodiode are mounted on laterally opposite sides of a circuit board. For example, the first photodiode and the second photodiode cover a same area on the circuit board. A plurality of thermally conductive vias may also be formed in the circuit board and extend between the first photodiode and the second photodiode. The light source may also be mounted on the circuit board, and the first and second photodiodes may be mounted on a respective first and second thermoelectric coolers mounted on the circuit board. The circuit board, the light source light guide, the first rigid light guide, and the second rigid light guide can be contained in a housing.

A relay optics can be attached to the guide tip. For example, the relay optics may include a collimator assembly, and a focus lens assembly distal to the collimator assembly. For example, the collimator assembly can include a collimator lens and a pupil stop. In an embodiment, the collimator assembly is fixed to the guide tip, while the focus lens assembly is releasably attachable to the collimator assembly.

In an embodiment, a position sensor includes a light source light guide including a light source light guide distal end adjacent a guide tip, an inner fiber arrangement including an inner fiber arrangement distal end adjacent the guide tip, an outer fiber arrangement including an outer fiber arrangement distal end adjacent the guide tip, a collimator assembly fixed to the guide tip, and a focus lens assembly releasably attachable to the collimator assembly, which can include a collimator lens and a pupil stop.

The position sensors in accordance with embodiments can be located in a variety of locations in the micro device transfer tool to support a variety of different processes. In a particular embodiment, the micro device transfer tool includes an articulating transfer head assembly including a mounting plate, a pivot mount assembly that is releasably attachable with the mounting plate, and a plurality of position sensors arranged over the pivot mount assembly to measure displacement of the pivot mount assembly at a plurality of locations. Generally, the pivot mount assembly may be a working substrate that can flex during the operation of the micro device transfer tool, and in particular during pick and place operations. Each position sensor can include a light source, a light source light guide including a light source light guide proximal end adjacent the light source and a light source light guide distal end adjacent a guide tip, a first photodiode, a first rigid light guide including a first rigid light guide proximal end adjacent the first photodiode and a first rigid light guide distal end adjacent the guide tip, a second photodiode, and a second rigid light guide including a second rigid light guide proximal end adjacent the second photodiode and a second rigid light guide distal end adjacent the guide tip. Thus, embodiments describe an articulating transfer head assembly that can include one or more light guide based position sensors behind a substrate that may flex during operation. In this manner the position sensors can detect distortions in the substrate, either due to temperature or deflection and adjust alignment of the articulating transfer head assembly. In an embodiment, the first photodiode and the second photodiode are mounted on laterally opposite sides of a circuit board. For example, the first photodiode and the second photodiode can cover a same area on the circuit board. A camera may additionally be mounted inside the articulating transfer head assembly and extend though an opening in the mounting plate adjacent to the pivot mount assembly to facilitate concurrent alignment processes.

BRIEF DESCRIPTION OF THE DRAWINGS

FIG. 10A is a schematic bottom view illustration of a bottom side of an articulating transfer head assembly including a pair of x-y offset cameras in accordance with an embodiment.

FIG. 10B is a schematic top view illustration of a pair of corresponding x-y offset reference marks in a display area of a target substrate in accordance with an embodiment.

FIG. 10C is a schematic top-down illustration of a method of aligning a pair of x-y offset cameras with a pair of x-y offset alignment features on a target substrate in accordance with an embodiment.

FIG. 16A is a schematic top view illustration of a concentric grating pattern superimposed over a plurality of subpixels in the pixel area of a display substrate in accordance with an embodiment.

FIG. 16B is a schematic top view illustration of a complementary concentric grating pattern aligned over the concentric grating pattern of FIG. 16A in accordance with an embodiment.

FIG. 17A is a schematic top view illustration of a concentric grating pattern superimposed over a plurality of subpixels in the pixel area of a display substrate in accordance with an embodiment.

FIG. 17B is a schematic top view illustration of a complementary concentric grating pattern aligned over the concentric grating pattern of FIG. 17A in accordance with an embodiment.

FIG. 23 is an isometric view illustration of a guide tip of a position sensor in accordance in accordance with an embodiment.

FIG. 24A is a schematic bottom view illustration of a guide tip of a position sensor in accordance with an embodiment.

FIG. 24B is a schematic cross-sectional view illustration of a right light guide in accordance with an embodiment.

FIG. 24C is a schematic cross-sectional view illustration of a rigid light guide including a fiber bundle in accordance with an embodiment.

DETAILED DESCRIPTION

Figure 1:
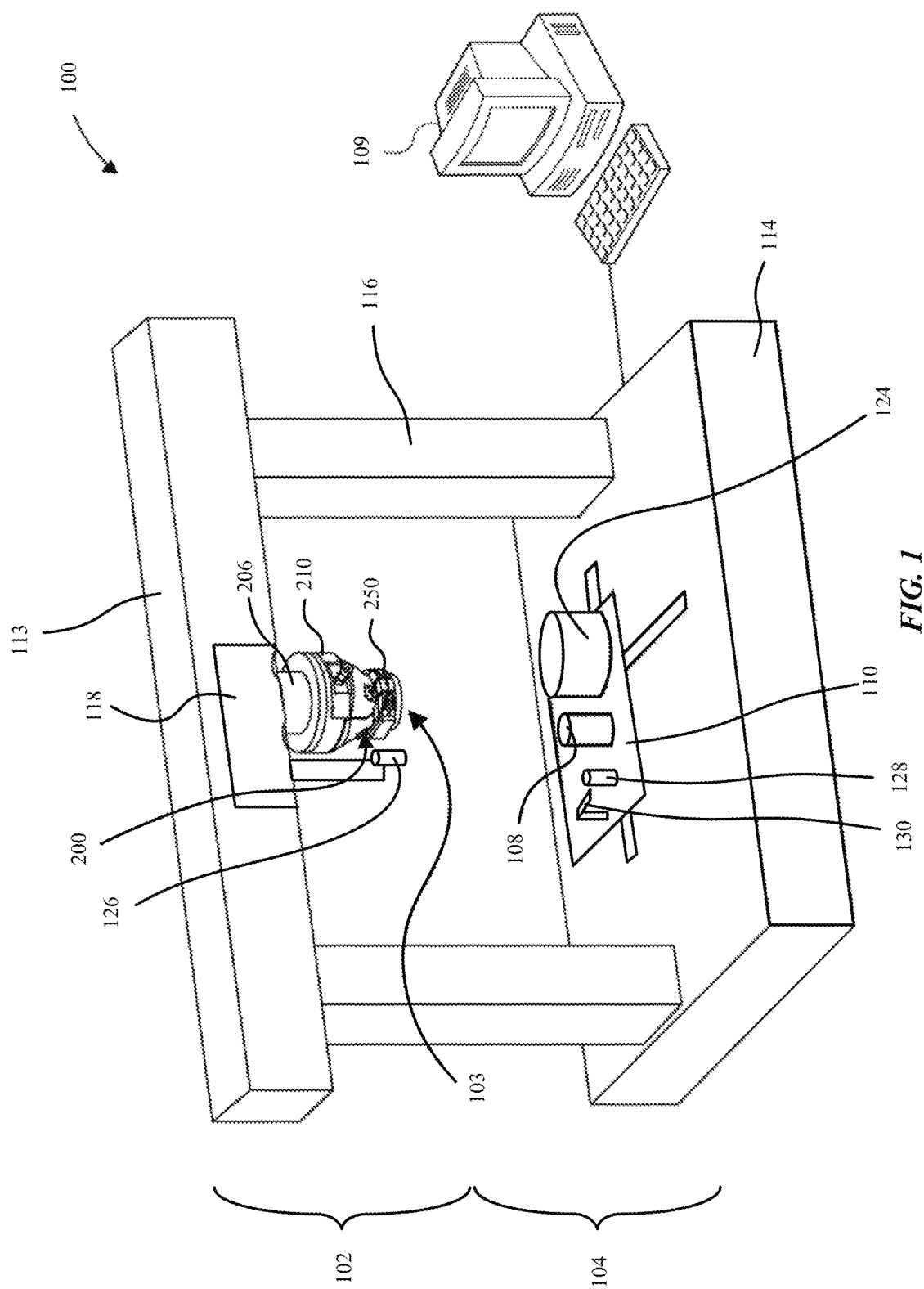
FIG. 1 is a perspective view of a micro device transfer tool in accordance with an embodiment.

Embodiments describe systems and methods for transferring a micro device or an array of micro devices to or from a substrate. For example, the array of micro devices may be micro LED devices. While some embodiments of the present invention are described with specific regard to micro LED devices, the embodiments of the invention are not so limited and certain embodiments may also be applicable to other micro LED devices and micro devices such as diodes, transistors, integrated circuit (IC) chips, MEMS, and bio-samples.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One component "over", "spanning" or "on" another component or bonded "to" or in "contact" with another component may be directly in contact with the other component or may have one or more intervening components. One component "between" components may be directly in contact with the competent or may have one or more intervening components.

In one aspect, embodiments describe a micro device transfer tool that includes an articulating transfer head assembly used to pick and place an array of micro devices. The articulating transfer head assembly in accordance with embodiments may provide six degrees of motion, including tip (Ox angular motion), tilt (Oy angular motion), z motion, x motion, y motion, and rotation (θz) during pick and place. The articulating transfer head assembly additionally can minimize parasitic lateral motions during motion at the plane of contact by establishing virtual axes of rotation in Ox, Oy at the interface of the target substrate and contact surface of a micro pick up array (MPA) attached to the articulating transfer head assembly.

In another aspect, embodiments describe a micro device transfer tool that includes one or more miniaturized cameras mounted within a piezoelectric stage assembly and extending through one or more openings in a bottom surface of a mounting plate. In this manner, the miniaturized camera(s) may be located laterally adjacent to the MPA, and in the same frame of reference which allows for a more accurate system alignment with reduced thermal drift and geometric error, which becomes particularly important with micro device transfer at elevated temperatures. As such, system alignment can be made with regard to the frame of reference of the MPA contact surface as opposed to an adjacent feature of the articulating transfer head assembly. This may be facilitated by an unconventional miniaturized camera design in which the optical lenses may have a diameter less than 5 mm, for example, and a working distance of greater than 500 µm, for example. In an embodiment, the camera outermost focal lens is located (laterally) less than an inch from a center of the MPA.

In another aspect, embodiments describe an alignment method in which an articulating transfer head assembly can be aligned over a target substrate using one or more cameras mounting in the articulating transfer head assembly. In an embodiment, an alignment method includes translating an articulating transfer head assembly over a place area of a target substrate. The articulating transfer head assembly can include an MPA including an array of transfer heads, a first camera offset from a center of the MPA in a first direction (e.g. x-direction) and pointing away from the MPA (e.g. toward the target substrate), and a second camera offset from the center of the MPA in a second direction (e.g. y-direction) and pointing away from the MPA (e.g. toward the target substrate). At least one of the cameras can then be aligned with one or more alignment features of the target substrate. This may facilitate aligning the array of transfer heads with corresponding target locations in the place area on the target substrate using the cameras located in the same frame of reference as the MPA, which can allow for a more accurate in-situ system alignment with reduced thermal drift and geometric error.

In another aspect, embodiments describe an alignment method in which relative x-y position between substrates is determined with a pair of encoders with concentric grating patterns. For example, each concentric grating pattern can be characterized by line widths, spacing, and radii. Radius offset of matching rings can create a phase offset to enhance signals for detection zones. One pattern can be on a moving component (e.g. on the MPA) and the other pattern can be on a fixed target (e.g. on a display substrate, or donor substrate). In an embodiment, the pattern is translated along an x-axis translation track with the articulating transfer head assembly between substrate holders. The patterns are configured such that misalignment in x, y, or both creates a varying moiré pattern. Relative misalignment of the patterns results in a continuously varying moiré pattern that would have a corresponding intensity field across the pattern. This field can be divided into zones (e.g. quadrants) that is measured by an array of intensity signal integrating sensors (e.g. photodiodes or a CMOS image sensors) located in each of the zones. Differences among the sensors can be used to determine relative x and y position between the moving and fixed encoder patterns, and hence substrates. In accordance with embodiments, such an alignment technique can be used to establish alignment between the substrates (e.g. MPA and target substrate) in a single measurement, with every transfer event. Thus, the alignment is dynamic, and can occur continuously during a mass transfer sequence at high transfer rates. Furthermore, such an intensity-based measurement method is less computationally intensive than an intensive image analysis, which facilitates a reduction of measurement times to the order of 1 microsecond or faster (1 MHz), which can further speed up the mass transfer sequences while maintaining fine alignment.

In yet another aspect, embodiments describe a micro device transfer tool that provides a prescribed amount of compression with force feedback during contact. In an embodiment, a kinetic sensory assembly is included to measure displacement of the pivot mount assembly at a plurality of locations during the pick and place operations. The measured feedback is then provided to adjust various system components to maintain parallelism, pressure uniformity, and a prescribed amount of compression. In an embodiment, the kinetic sensor assembly includes a plurality of position sensors (e.g. displacement probes). The position sensors in accordance with embodiments may include various structural features that can mitigate drift, including rigid light guides to mitigate drift due to flexing, and packaging considerations such as photodiodes being mounted on opposite sides of a circuit board to mitigate thermal drift. Furthermore, the rigid light guides and packaging solutions facilitate a miniaturized assembly that can be easily integrated in a variety of locations of the micro device transfer tool. Accordingly, such position sensors are not limited to a kinetic sensor assembly and can be located at other various locations to support different functions such as upward or downward facing probes for setting a z-datum, leveling of the MPA, articulating transfer head assembly, and target substrate chuck leveling. Furthermore, the position sensors in accordance with embodiments may include relay optics that include a fixed collimator assembly, and replaceable focus lens assembly for multiple different applications across the micro device transfer tool that may utilize different working ranges or sensitivity. As used herein the term "position sensor" is intended to cover either or both measurements of an absolute distance (e.g. position), as well as a change in position (e.g. displacement).

Referring now to FIG. 1, a perspective view illustration of a micro device transfer tool 100 is shown in accordance with an embodiment of the invention. The micro device transfer tool 100 includes one or more assemblies having various components and sub-assemblies with functions that facilitate the mass transfer of micro devices using an array of electrostatic transfer heads. For example, the micro device transfer tool 100 can include an upper assembly 102 having an articulating transfer head assembly 200 to receive a micro pickup array (MPA) containing an array of transfer heads. In an embodiment, the MPA includes an array of micro electrostatic assemblies (MESAs), also referred to as electrostatic transfer heads, where each MESA operates in accordance with electrostatic principles to pick up and transfer a corresponding micro device. In an embodiment each MESA has a localized contact point characterized by a maximum dimension of 1-300 µm in both the x- and y-dimensions. In an embodiment, each MESA has a maximum lateral dimension of 1 to 100 µm, or less. In some embodiments, each MESA has a maximum length and width of 20 µm, 10 µm, or 5 µm. Similarly, each micro device, such as a light emitting diode or chip, may have a maximum lateral dimension of 1-300 µm or 1-100 µm, such as 20 µm, 10 µm, or 5 µm. The articulating transfer head assembly 200 can include features that allow for the exchange of the MPA and for delivering a voltage to the electrostatic transfer heads to facilitate pick up of a micro device using an electrostatic force.

The articulating transfer head assembly 200 in accordance with embodiments may provide for negligible lateral or vertical parasitic motion for small movements of MPA 103, e.g., motion less than about 5 mrad about a neutral position. In an embodiment, the articulating transfer head assembly includes a tip-tilt assembly 210 and a piezoelectric stage assembly 250 mounted underneath the tip-tilt assembly 210. Together the tip-tilt assembly 210 and the piezoelectric stage assembly 250 may provide six degrees of motion. Specifically, the tip-tilt assembly 210 may provide tip ($\theta$x) and tilt ($\theta$y), where the piezoelectric stage assembly 250 provides z motion, x motion, y motion, and rotation ($\theta$z).

The micro device transfer tool 100 can also include a lower assembly 104 having a carrier substrate holder 108 and a receiving substrate holder 124. The carrier substrate holder 108 can be configured to hold a carrier substrate (e.g. donor substrate) supporting an array of micro devices. Furthermore, the receiving substrate holder 124 can be configured to hold a receiving substrate (e.g. display substrate) for receiving the transferred micro devices. Thus, the array of micro devices can be transferred from the carrier substrate to the receiving substrate using the array of electrostatic transfer heads. It will be appreciated that any reference to upper assembly 102 and lower assembly 104 is made for case of description only, and that some components and subassemblies of micro device transfer tool 100 may be transposed.

The various components and subassemblies can be coupled in various manners, e.g., through the use of a gantry 113, base 114, side beams 116, carriage 118, and other structural connectors. Therefore, it will be appreciated that the micro device transfer tool 100 shown in FIG. 1 is not exhaustive of all components that can be part of a system in accordance with the scope of this invention, nor should the description be considered to be limiting in this regard.

The articulating transfer head assembly 200 may be fixed to a carriage 118 of the micro device transfer tool 100 e.g., at a location along a translation track and be moveable in the x, y, or z directions for translation between stages (e.g. for the substrate holders), as well as for tipping, tilting, rotating, and movement of the MPA 103 in a z direction based on feedback signals within the micro device transfer tool 100. The carrier substrate holder 108 and receiving substrate holder 124 may also be movable in the x, y, or z directions with a stage 110. While a single stage 110 is illustrated, it is to be appreciated that each subsystem (e.g. carrier substrate holder 108, receiving substrate holder 124, etc. can be located on a separate stage 110).

Operation of micro device transfer tool 100 and transfer head assembly 200 may be controlled at least in part by a host computer 109. Host computer 109 may control the operation of articulating transfer head assembly 200 based on feedback signals received from various sensors, strain sensing elements, and image data.

The micro device transfer tool 100 may include various sensors (e.g. cameras, position sensors, etc.) that are intended to sense spatial relationships between system components and to work together to facilitate alignment of system components. For example, a downward-looking camera 126 or 290 (see FIG. 2) and an upward-looking camera (140, see FIG. 7) or 128 can be aligned with one another using an alignment tool 130 in order to establish a frame of reference that components can be adjusted within.

Similarly, position sensors (400, FIG. 4) can be integrated within the micro device transfer tool 100 to further establish the frame of reference that components can be adjusted within. The various sensors can also be used to detect positions of components within the frame of reference and to provide feedback to a host computer 109 capable of receiving and processing inputs in order to control the system components accordingly.

Figure 2:
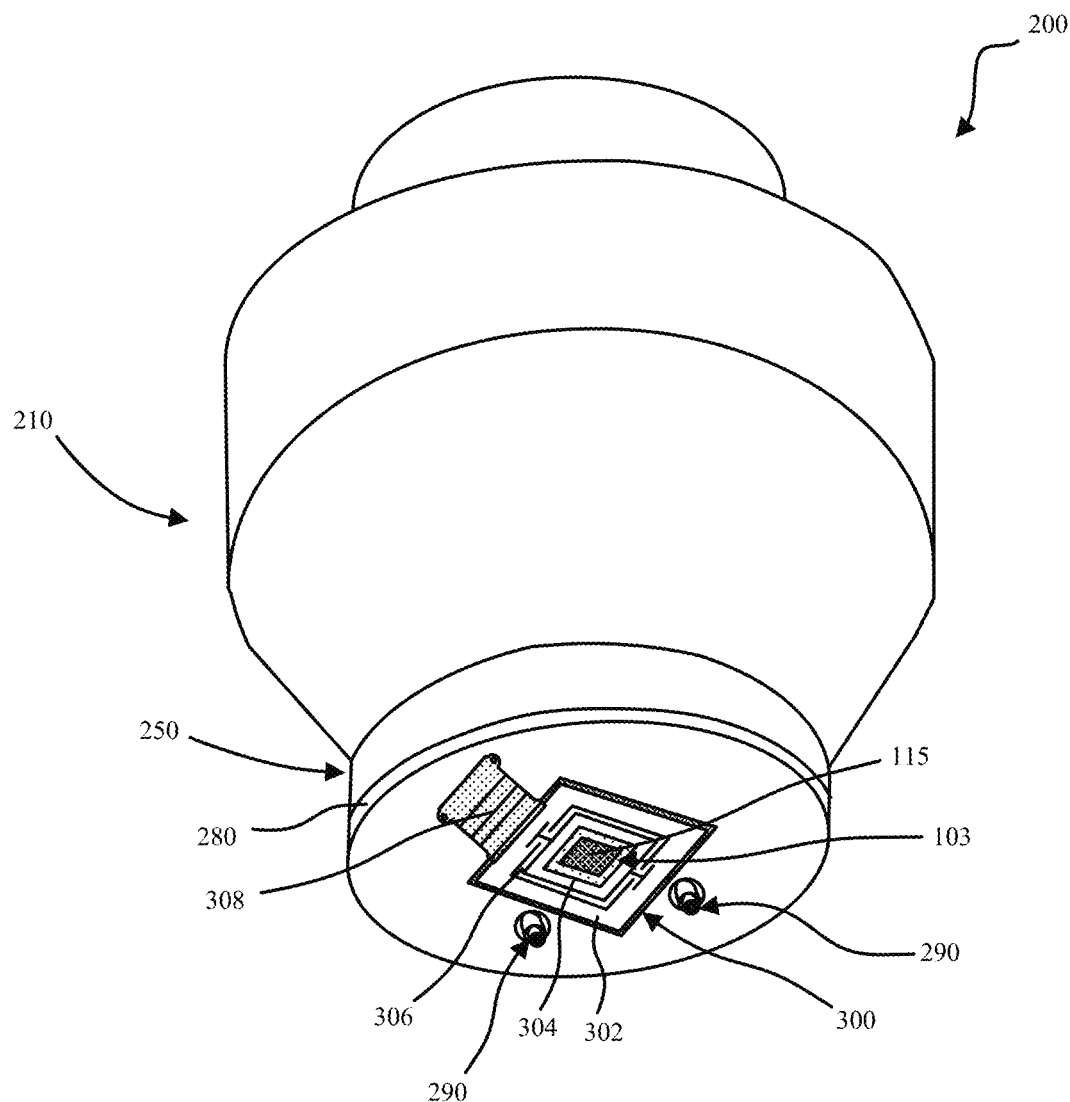
FIG. 2 is a bottom side perspective view of an articulating transfer head assembly in accordance with an embodiment.

Referring to FIG. 2, a perspective view of an articulating transfer head assembly 200 is shown in accordance with an embodiment. An articulating transfer head assembly 200 may be used in the micro device transfer tool 100 to transfer micro devices to or from a substrate, e.g., receiving substrate or donor substrate, using MPA 103 which is supported by a pivot mount assembly 300. More particularly, articulating transfer head assembly 200 may provide for negligible lateral or vertical parasitic motion for small movements of MPA 103, e.g., motion less than about 5 mrad about a neutral position.

In the particular embodiment illustrated a mounting plate 280 is secured underneath the piezoelectric stage assembly 250. The pivot mount assembly 300 may be mounted onto the mounting plate 280 using a variety of manners such as using tabs or lips to press the pivot mount against the articulating transfer head assembly 200, bonding, vacuum, electrostatic clamping, or pogo pin array board. The pivot mount assembly 300 may include a support structure (e.g. base) 302, a pivot platform 304, and plurality of spring arms 306, and the MPA 103 supporting an array of MESAs 115 is mounted on the pivot platform 304. In an embodiment, the pivot mount assembly 300 may include a flex circuit 308 to communicate with a printed circuit board (PCB) that is located nearby within the articulating transfer head assembly 200 to reduce signal degradation by limiting a distance that signals must travel.

Figure 3A:
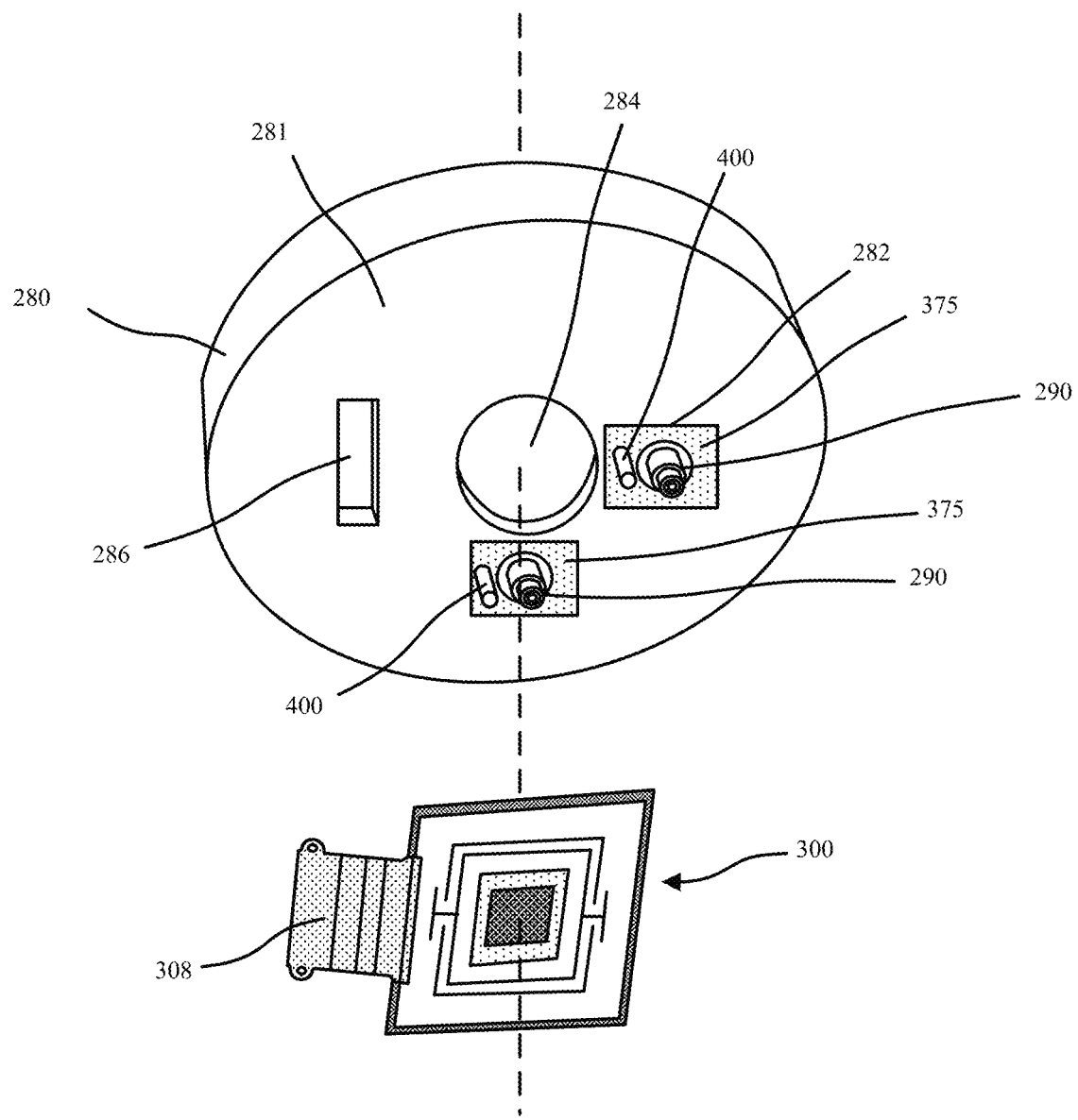
FIG. 3A is an exploded perspective view illustration of a pivot mount assembly and mounting plate in accordance with an embodiment.

In accordance with embodiments, one or more cameras 290 can be mounted within the piezoelectric stage assembly 250 and extend through one or more corresponding openings 282 in a bottom surface 281 of the mounting plate 280. As shown in FIG. 3A, the openings 282 are off-centered in the mounting plate. In this manner, the miniaturized camera(s) 290 may be located laterally adjacent to the MPA 103 once mounted onto the pivot mount assembly 300. In the particular embodiment illustrated the cameras 290 are positioned in x-y offset directions from the MPA 103 (e.g. from a center of the MPA 103, or center of the mounting plate 280) and primary translation direction. For example, the cameras 290 can be located at a 3 o'clock position located parallel to an x-axis translation direction (e.g. between the carrier substrate holder 108 and receiving substrate holder 124), and also a 6 o'clock position (or 12 o'clock position) being orthogonal to the 3 o'clock position relative to a center of the MPA 103, and mounting plate 280 center. It is to be appreciated that such positions are exemplary, and it is not required for the camera 290 positions to be parallel or orthogonal to the translation axis of the articulating transfer head assembly 200. One or more position sensors 400 may also extend through the same or different openings 282. Additionally, a slot opening 286 can be formed through the mounting plate 280 to accommodate the flex circuit 308. In this manner, the flex circuit 308 can pass through a slot opening 286 and mate with a pogo pin array 380, for example, on the back side of the mounting plate 280 (see FIG. 4). Alternatively, the pogo pin array 380 can be mounted on the bottom (mounting) surface 281 of the mounting plate 280. Also shown in FIG. 3A a center-opening 284 is formed through a center of the mounting plate 280.

Figure 4:
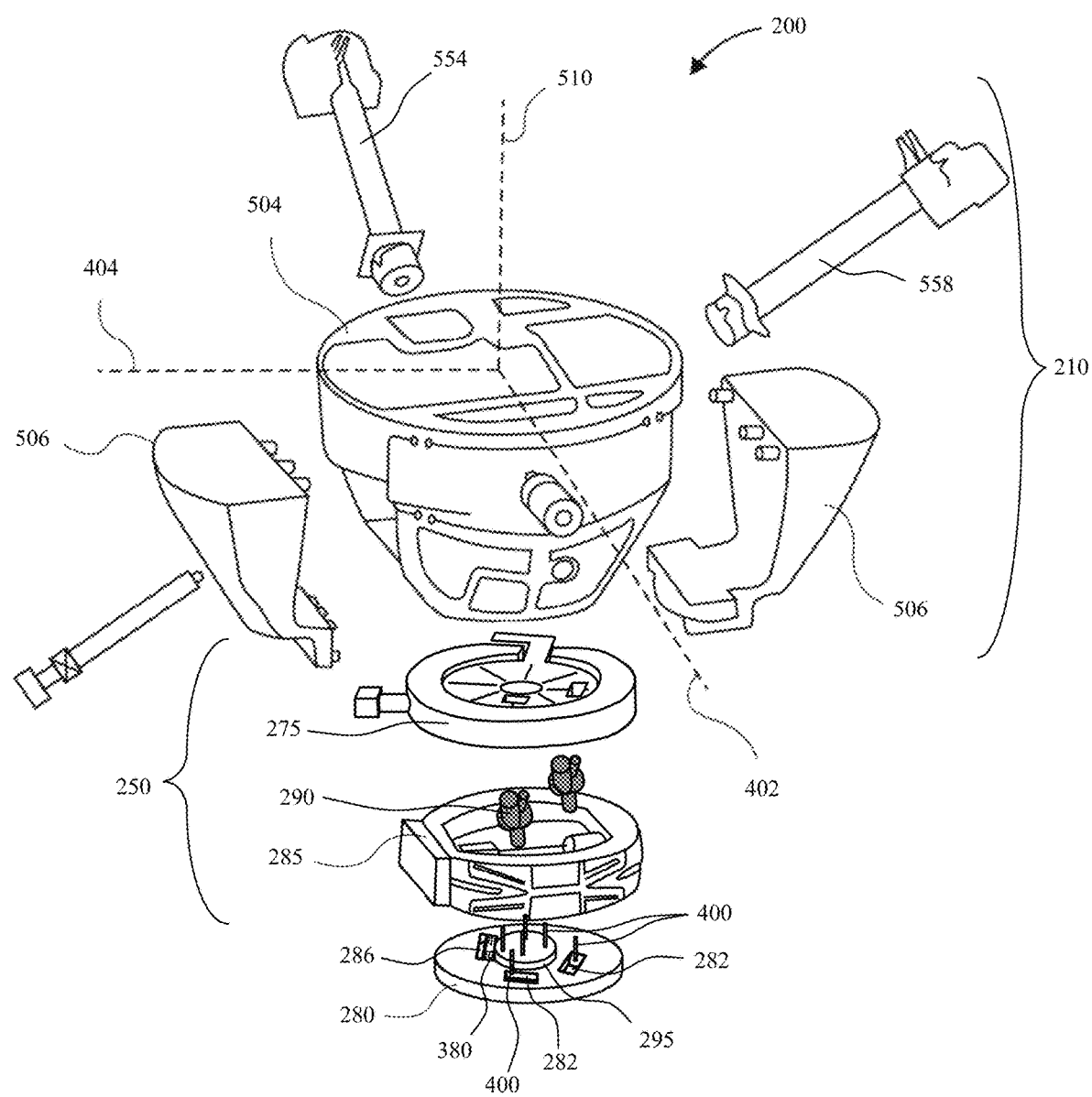
FIG. 4 is an exploded view of an articulating transfer head assembly in accordance with an embodiment.

The pivot mount assembly 300 may then be releasably attached to the mounting plate 280 such that the pivot mount assembly spans underneath the center-opening 284, which can accommodate flexing of the pivot mount assembly 300 during pick and place operations. Furthermore, as shown in FIG. 4, a kinetic sensor assembly 295 can be mounted over the center-opening 284 to measure deflection of the pivot mount assembly 300.

In some embodiments the camera(s) 290 can be mounted on/within a low coefficient of thermal expansion (CTE) structure. For example, the camera may be mounted on the mounting plate 280, and within the piezoelectric stage assembly 250. The mounting plate 280 may be formed of a low-CTE material, and may include one or more components. Exemplary low-CTE materials may be characterized by a CTE of less than 5 ppm/° C., or more particularly less than 2 ppm/° C. Exemplary materials include metals such as nickel-iron alloys (e.g. FeNi36), ceramics, etc.

Figure 3B:
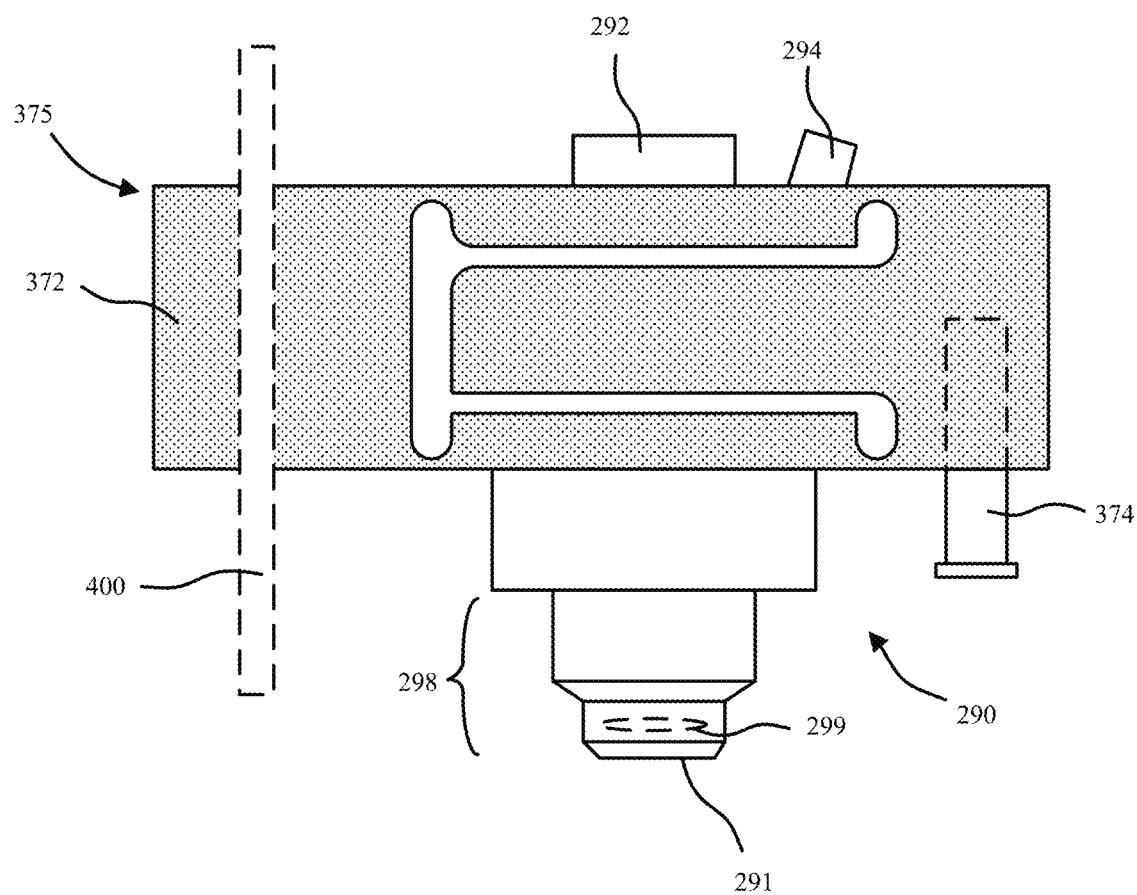
FIG. 3B is a schematic cross-sectional side view illustration of a camera mounted on a z-adjustment stage in accordance with an embodiment.

In some embodiments the camera(s) 290 can be mounted on/within a z-adjustment stage. FIG. 3B is a schematic cross-sectional side view illustration of a camera 290 mounted on a z-adjustment stage 375 in accordance with an embodiment. The z-adjustment stage 375 in turn is mounted on the mounting plate 280 such that the camera 290 can extend through the opening 282. The z-adjustment stage 375 may be a flexure stage for low backlash. For example, the z-adjustment stage 375 may include a body 372 (e.g. formed of the low-CTE material) including one or more living hinge flexures to provide low or no hysteresis and repeatable motion. An actuator 374 may be included to cause movement of the z-adjustment stage 375. One or more position sensors 400 may also be optionally mounted on the z-adjustment stage 375.

The z-adjustment stage 375 may allow independent movement of the camera 290 along the z-axis relative to the MPA 103 and mounting plate 280. Such independent movement can allow the camera 290 to focus on the object plane, or frame of reference. In an embodiment the z-adjustment stage 375 can be motorized for automation. Such a configuration may be utilized to automatically move the camera 290 in coordination with a pick or place sequence to maintain focus during the sequence.

In accordance with embodiments, the camera(s) 290 may be located laterally adjacent to the MPA 103, and in the same frame of reference which allows for a more accurate system alignment with reduced thermal drift and geometric error, which becomes particularly important with micro device transfer at elevated temperatures. As such, system alignment can be made with regard to the frame of reference of the MPA contact surface (e.g. localized contact surface of the MESAs) as opposed to an adjacent feature of the articulating transfer head assembly 200. This may be facilitated by an unconventional miniaturized camera 290 design in which the exterior-most lens 299 of the camera 290 has a diameter less than 5 mm, for example, and a working distance of greater than 500 μm, for example. In an embodiment, the camera outermost focal lens is located (laterally) less than an inch from a center of the center-opening 284, and consequently the MPA 103.

Camera(s) 290 in accordance with embodiments may be miniaturized systems including a light source 294, such as a light emitting diode, sensors 292, and objective lens assembly 298. The exterior-most lens 299 of the objective lens assembly 298 may be the most distal lens located nearest the bottom lens flange 291 of the camera 290. In operation the bottom lens flange 291 may be located above the MESAs on the MPA to avoid the potential for a collision incident, yet still close enough to focus on the frame of reference or object plane. Thus, automation of the camera 290 z-height can be used to maintain the camera in focus during a pick or place operation. In an embodiment, the camera 290 has a working distance of greater than 500 µm, for example, allowing the bottom lens flange 291 remain above the MESAs on the MPA while maintaining a minimum z-height difference from MPA to object plane less than the z-travel range of the piezoelectric stage assembly 250. In an embodiment, the camera 290 has a numerical aperture (NA) of 0.25 or greater, allowing spatial resolutions ranging from 0.8 µm to 1.4 µm. In a further embodiment, the camera 290 has a numerical aperture of 0.45, allowing spatial resolutions of approximately 0.45 µm to 0.8 µm. Such spatial resolutions can be particularly useful for imaging microdevices with lateral dimensions as small as 1 µm. It is to be appreciated that further miniaturization of the camera 290 could potentially lead to a reduced working distance, along with associated changes to related parameters.

In an embodiment, articulating transfer head assembly 200 includes multiple linkages having independent ranges of motion. For example, articulating transfer head assembly 200 may include a θx-linkage 504 (for Ox angular motion) coupled with carriage mount 206 and having links interconnected at joints such that the links exhibit kinematics in a first plane, e.g., movement of θx-linkage 504 may include a coupler link tipping relative to a ground link. Articulating transfer head assembly 200 may also include a θy-linkage 506 (for Oy angular motion) coupled with θx-linkage 504 and having links that exhibit kinematics in a second plane different than the first plane, e.g., movement of θy-linkage 506 may include a coupler link tilting relative to a ground link. An x-actuator 554 (e.g. linear actuator) may impart a biasing load to ex-linkage 504 structure, while a y-actuator 558 may impart a biasing load to the θy-linkage 506 structure.

Figure 5:
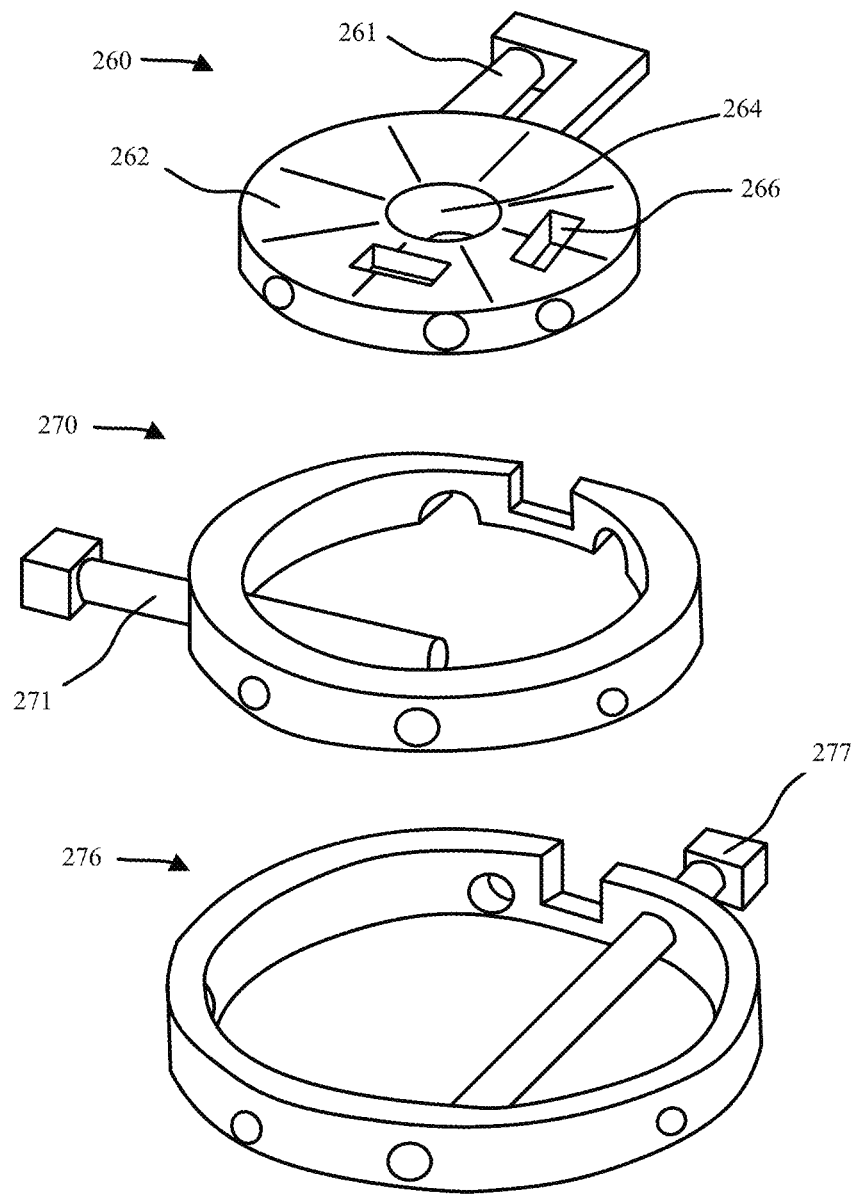
FIG. 5 is an exploded view of a plurality of nestled stages in accordance with an embodiment.

In the particular arrangement, the piezoelectric stage assembly 250 is coupled with the θy-linkage 506 to provide additional ranges of motion. For example, the piezoelectric stage assembly 250 may include a z-flexure assembly 285 (or z-stage) with a structure that lengthens and shortens along a z-axis 510. In an embodiment, the one or more cameras 290 are mounted in the z-flexure assembly 285. The piezoelectric stage assembly 250 can additionally include a plurality of nested stages 275 that are nested inside one another. Referring briefly to FIG. 5, this may include an x-stage assembly 270 with corresponding flexure and actuator 271 for motion along the x-axis 404, a y-stage assembly 276 with corresponding flexure and actuator 277 for motion along the y-axis 402, and θz stage assembly 260 with corresponding θz stage 262 and actuator 261 for rotational motion of the θz stage 262 about a z-axis 510. Specifically, the x-stage assembly 270 and y-stage assembly 276 can cause motion of the θz stage 262 in the x, y directions. The z-flexure assembly 285 can be coupled with the θz stage 262, such that motion of the θz stage 262 in either the x, y, or θz directions is transferred to the z-flexure assembly 285, and hence the mounting plate 280. As shown, the x-stage assembly 270 and y-stage assembly 276 are rim structures including bore holes for the actuators of each of the stages. In the particular arrangement illustrated the x-stage assembly 270 is nested inside the y-stage assembly 276, and the θz stage 262 of the θz stage assembly 260 is nested inside the x-stage assembly 270. The θz stage 262 may optionally include a center-opening 264 and various other openings 266 to accommodate additional components (e.g. cameras, position sensors) or electrical connections.

Referring again to FIG. 4, the mounting plate 280 may be secured to an underside of the piezoelectric stage assembly 250, such as to an underside of the z-flexure assembly 285. A kinetic sensor assembly 295 can be mounted over the center-opening 284 to measure deflection of the pivot mount assembly 300. In an embodiment, the kinetic sensor assembly 295 includes a plurality of position sensors 400, such as light guide displacement sensors, laser displacement sensors, etc. One or more position sensor(s) 400 may also be secured through opening(s) 282, for example, to be positioned adjacent a camera 290.

Figure 6A:
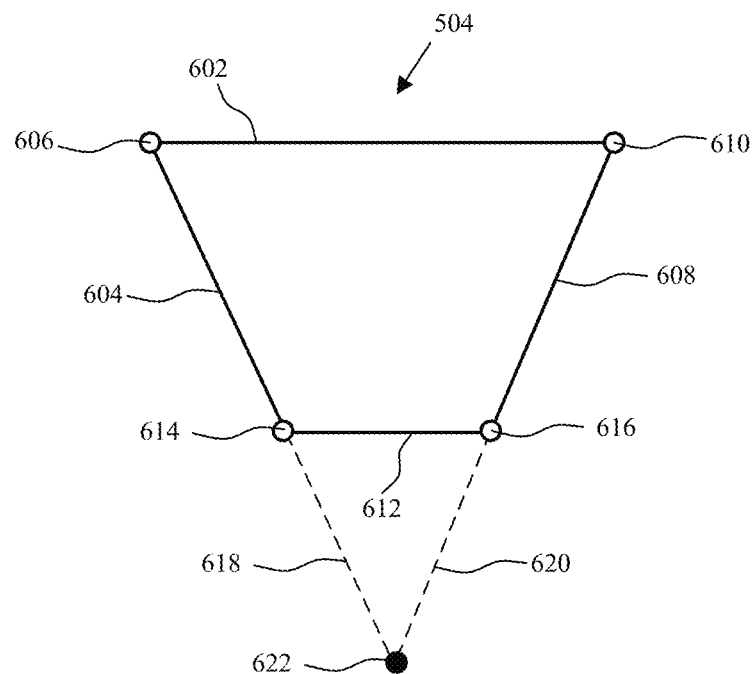
FIG. 6A is a cross-sectional plan view of a θx-linkage of an articulating transfer head assembly in accordance with an embodiment.
Figure 6B:
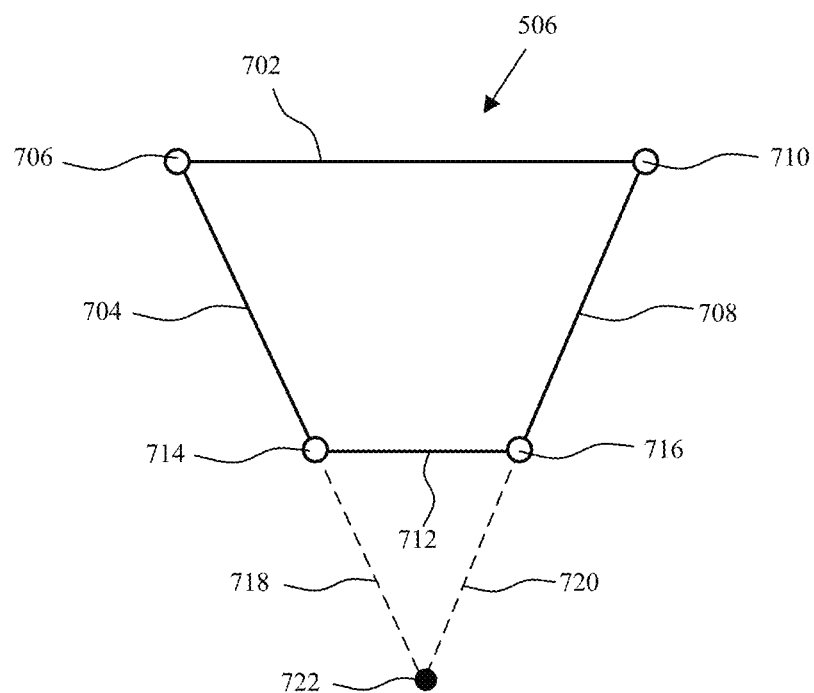
FIG. 6B is a cross-sectional plan view of a θy-linkage of an articulating transfer head assembly in accordance with an embodiment.

In an embodiment, ex-linkage 504, θy-linkage 506, and piezoelectric stage assembly 250 are structurally connected such that kinematics of each linkage is related but independent. Referring now to the schematic illustrations in FIGS. 6A-6B in combination with FIG. 4, the ex-linkage 504 includes a ground link 602, which may be fixed relative to the carriage mount, and a left link arm 604 connected to the ground link 602 with an upper left joint 606. For example, this may be a living hinge flexure that allows the θx-linkage left link arm 604 to pivot relative to the ex-linkage ground link 602. θx-linkage 504 may also include θx-linkage right link arm 608 located opposite z-axis 510 from θx-linkage left link arm 604. More particularly, θx-linkage right link arm 608 may pivot about an ex-linkage upper right joint 610, which may be located opposite the x-z plane, i.e., the plane encompassing x-axis 404 and z-axis 510, from ex-linkage upper left joint 606. θx-linkage 504 may also include θx-linkage coupler 612 connected with one or both of θx-linkage left link arm 604 and θx-linkage right link arm 608. For example, θx-linkage coupler 612 may connect with ex-linkage left link arm 604 at ex-linkage lower left joint 614 and θx-linkage coupler 612 may connect with θx-linkage right link arm 608 at θx-linkage lower right joint 616. Thus, ex-linkage 504 may include a four-bar linkage having a ground link, two link arms, and a coupler link, interconnected by four joints 606, 610, 614, 616.

In an embodiment, θy-linkage 506 includes at least one link arm connected to θy-linkage 506 ground link 702. For example, a θy-linkage left link arm 704 may connect to θy-linkage ground link 702 at a θy-linkage upper left joint 706. θy-linkage upper left joint 706 may include a living hinge flexure that allows θy-linkage left link arm 704 to pivot relative to θy-linkage ground link 702. θy-linkage 506 may also include θy-linkage right link arm 708 located opposite z-axis 510 from θy-linkage left link arm 704. More particularly, θy-linkage right link arm 708 may pivot about a θy-linkage upper right joint 710, which is located opposite the y-z plane, encompassing y-axis 402 and z-axis 510, from θy-linkage upper right joint 710. θy-linkage 506 may also include θy-linkage coupler 712 connected with one or both of θy-linkage left link arm 704 and θy-linkage right link arm 708. For example, θy-linkage coupler 712 may connect with θy-linkage left link arm 704 at θy-linkage lower left joint 714 and θy-linkage coupler 712 may connect with θy-linkage right link arm 708 at θy-linkage lower right joint 716. Thus, in an embodiment, θy-linkage 506 includes a linkage structure similar to θx-linkage 504, having a ground link, two link arms, and a coupler link, interconnected by four joints 706, 710, 714, 716.

The θx-linkage coupler 612 of θx-linkage 504 may carry a ground link 702 of θy-linkage 506, and a θy-linkage coupler 712 of θy-linkage 506 may carry a second end of piezoelectric stage assembly 250 such that movement of any of ex-linkage 504, θy-linkage 506, and piezoelectric stage assembly 250 results in a relative movement between carriage mount 206 and mounting plate 280. Rather than being fixed relative to carriage mount 206, θy-linkage ground link 702 may be moveable relative to carriage mount 206. More particularly, θy-linkage ground link 702 may be fixed relative to ex-linkage coupler 612. Accordingly, when θx-linkage 504 is moved by actuating ex-linkage 504 link arms, θx-linkage coupler 612 moves relative to carriage mount 206 and since θy-linkage ground link 702 is carried on ex-linkage coupler 612, so may θy-linkage ground link 702 move relative to carriage mount 206.

In an embodiment, the interrelated movement of θx-linkage 504, θy-linkage 506, and piezoelectric stage assembly 250 may nonetheless be independent, such that movement of any one of the components provides pure motion of mounting plate 280. For example, movement of θx-linkage 504 may cause mounting plate 280 to tip relative to carriage mount 206, movement of θy-linkage 506 may cause mounting plate 280 to tilt relative to carriage mount 206, and movement of z-flexure assembly 285 of the piezoelectric stage assembly 250 may cause mounting plate 280 to extend away from or retract toward carriage mount 206. Likewise, movement of the θz stage assembly 260 will rotate the mounting plate 280 about the z-axis relative to the carriage mount 206, and actuation of the x-stage assembly 270 or y-stage assembly 276 may move the mounting plate in the x or y direction, respectively, relative to the carriage mount 206. Such relative movement between mounting plate 280 and carriage mount 206 may be independently constrained within the ranges of motion of each linkage without motion in one reference frame causing motion in another. For example, tipping of mounting plate 280 within a first plane caused by movement of θx-linkage 504 may not include any parasitic tilting in a second plane. Thus, decoupling the linkages may provide pure motion of mounting plate 280 about different rotational centers and in different axial directions.

The linkages may further be aligned with planes that are substantially orthogonal, i.e., ex-linkage 504 and θy-linkage 506 may be substantially orthogonal to each other. For example, θx-linkage 504 may act within a y-z plane encompassing a y-axis 402 and z-axis 510, while θy-linkage 506 may act within an x-z plane encompassing an x-axis 404 and z-axis 510.

In an embodiment, θx-linkage 504 and θy-linkage 506 are geometrically symmetric. For example, the links of ex-linkage 504 and θy-linkage 506 may have substantially equal lengths. More particularly, corresponding links of each linkage may or may not have substantially equal lengths. For example, link arms of each linkage may have a same first length and coupler links of each linkage may have a same second length, but the first length may or may not be equal to the second length. Equal length links may provide for a similar thermal response of θx-linkage 504 and θy-linkage 506 to environmental changes. For example, if temperatures local to the articulating transfer head assembly 200 change due to heating provided during use, each of the links may undergo similar thermal expansion.

ex-linkage 504 and θy-linkage 506 may have linkage angles that are symmetric about a given reference geometry, and may be structurally symmetric. For example, an angle between link arms of each linkage and z-axis 510 may be equal, or approximately equal, and the linkages may have a same composite stiffness. Therefore, linkage response to actuator inputs may be similar. For example, given that ex-linkage 504 and θy-linkage 506 may have similar geometric angles, actuation of respective link arms by respective actuators 554, 558 may cause similar angular changes of the link arms relative to z-axis 510. More particularly, an x-actuator 554 coupled with an θx-linkage 504 link arm and a y-actuator 558 coupled with a θy-linkage 506 link arm may be moved similar amounts to cause similar tipping or tilting responses in θx-linkage 504 and θy-linkage 506, respectively.

In addition to exhibiting symmetries about respective planes passing through z-axis 510, θx-linkage 504 and θy-linkage 506 may also be symmetric relative to each other. That is, upper joints 606, 610 of ex-linkage 504 may be coplanar within an upper plane relative to upper joints 706, 710 of θy-linkage 506. Similarly, lower joints 614, 616 of ex-linkage 504 may be coplanar within a lower plane relative to lower joints 714, 716 of θy-linkage 506.

In an embodiment, θx-linkage 504 includes a remote tipping center 622 located at an intersection of θx-linkage left axis 618 and θx-linkage right axis 620. Remote tipping center 622 may be a virtual center of rotation with a spatial position that remains constant as θx-linkage 504 link arms change orientation. For example, in an embodiment, as θx-linkage left link arm 604 pivots about ex-linkage upper left joint 606, a corresponding motion of θx-linkage right link arm 608 may cause the angles between ex-linkage left axis 618, ex-linkage right axis 620, and z-axis 510 to change. However, the location of remote tipping center 622 may remain stationary despite the change in linkage geometry. More particularly, as θx-linkage 504 geometry changes, θx-linkage coupler 612 may rotate about remote tipping center 622. Thus, a point on an object that is fixed relative to θx-linkage coupler 612 and located at remote tipping center 622 may experience pure rotation, unaccompanied by translational parasitic motion, when θx-linkage 504 geometry is varied.

Similarly, θy-linkage 506 may include a remote tilting center 722 located at an intersection of θy-linkage left axis 718 and θy-linkage right axis 720. Remote tilting center 722 may be a virtual center of rotation with a spatial position that remains constant as θy-linkage 506 link arms change orientation. For example, in an embodiment, as θy-linkage left link arm 704 pivots about θy-linkage upper left joint 706, a corresponding motion of θy-linkage right link arm 708 may cause the angles between θy-linkage left axis 718, θy-linkage right axis 720, and z-axis 510 to change. However, the location of remote tilting center 722 may remain stationary despite the change in linkage geometry. More particularly, as θy-linkage 506 geometry changes, θy-linkage coupler 712 may rotate about remote tilting center 722. Thus, a point on an object that is fixed relative to θy-linkage coupler 712 and located at remote tilting center 722 may experience pure rotation, unaccompanied by translational parasitic motion, when θy-linkage 506 geometry is varied.

The remote tipping center 622 and remote tilting center 722 may be co-incident, at the same location, and the phenomenon of pure rotation about the remote tipping and tilting centers 622, 722 may be exploited by locating transfer elements for which parasitic motion is undesirable at the remote tipping and tilting centers 622, 722. For example, the MESAs on an MPA 103 may be co-located with the remote tipping and tilting centers 622, 722 so that the MESAs experience pure tipping and tilting and remain in the same lateral location, rather than shifting under parasitic translation and potentially smearing a corresponding micro device on a target substrate surface.

In the following discussion related to FIGS. 7-10F various alignment methods and structures are described for aligning the articulating transfer head assembly. Generally, this can include system alignment in which a frame of reference is established. For example, this may include establishing a reference plane with an x-y datum, as well as a z-datum. In an embodiment, the frame of reference is to correspond to the MESA contact surfaces of the MPA 103. Furthermore, the co-incident remote tipping center 622 and remote tilting center 722 may be located at a center of the frame of reference at a center of the MPA 103.

Figure 7:
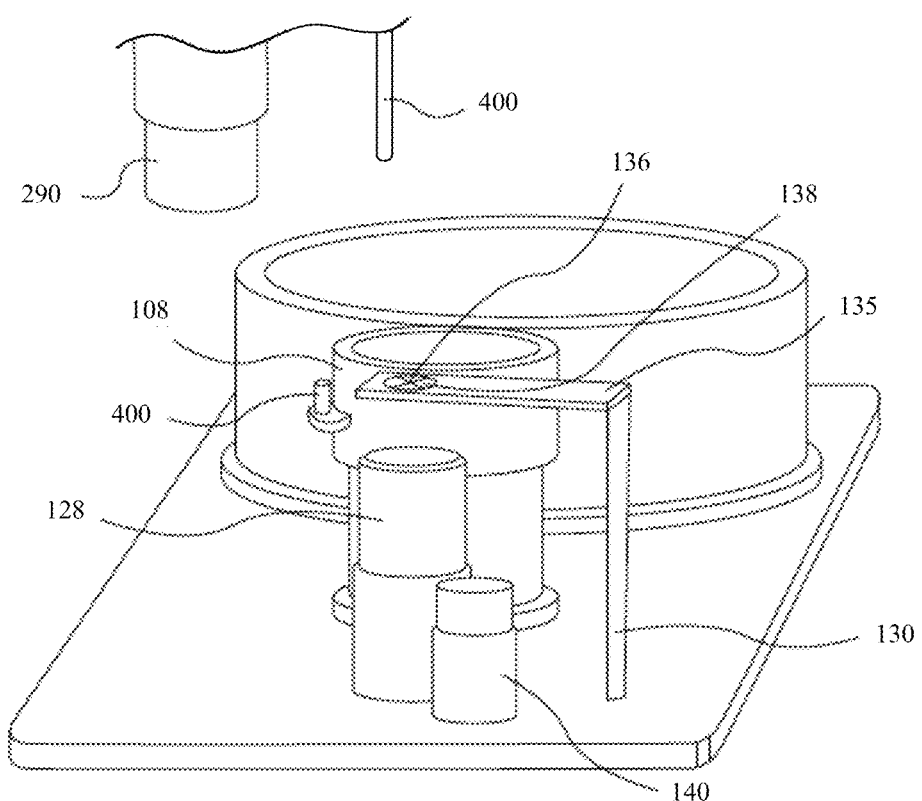
FIG. 7 is a perspective view illustration of various cameras and sensors of a micro device transfer tool in accordance with an embodiment.

Referring now to FIG. 7, a perspective view illustration is provided of a portion of a micro device transfer tool 100 including one or more cameras 290, 128. For example, a camera 290 can be coupled with upper assembly 102 and within the piezoelectric stage assembly 250 as previously described. In an embodiment, camera 128 can be coupled to the lower assembly 104 and located near the carrier substrate holder 108 or donor substrate holder. In an embodiment, camera 128 can be fixed relative to the stage 110, or more particularly to the carrier substrate holder 108 and the receiving substrate holder 124. Thus, in an embodiment, movement of either camera to view a new location of interest results in a corresponding movement of the related articulating transfer head assembly 200 or target substrate holder 108, 124. In this way, relative motion between the articulating transfer head assembly 200 and target substrate holder 108, 124 can be determined based on movements of cameras 290, 128.

The camera 128 can include a camera having sufficient resolution and range of focus to view a single MESA structure. For example, the camera can have an image resolution allowing dimensions of less than one micrometer to be resolved. The camera 290 can include a camera having sufficient resolution and range of focus to view a single micro device supported by target substrate (e.g. carrier substrate, receiving substrate).

In an alternative embodiment, there may be multiple cameras located on each of the upper and lower assemblies 102, 104. For example, each subassembly can include high magnification and low magnification cameras. By way of example and not limitation, the low magnification cameras 126, 140 may be used to provide feedback inputs to host computer 109 for controlling gross adjustments and movements of the system while the high magnification cameras 290, 128 may be used to provide feedback inputs to host computer 109 for controlling fine adjustments and movements of the system.

It will be appreciated that cameras represent only one alternative for providing feedback related to the position of the upper and lower subassemblies 102, 104 or components attached thereto. Other devices can be contemplated within the scope of this disclosure. For example, rather than utilizing cameras, the micro device transfer tool 100 may include position (proximity) sensors 400, such as capacitive sensors, laser sensors, or position sensors.

In an embodiment, to facilitate establishing a reference point between cameras 290, 128, the micro device transfer tool 100 can include an alignment tool 130. In an embodiment, the alignment tool includes a fiducial mark 136. For example, the fiducial mark 136 can be a part of a transparent plate 138 (e.g., glass) that is supported by an alignment bracket 135. More particularly, plate 138 having fiducial mark 136 can be positioned between an upward-viewing camera 128 and a downward-viewing camera 290. In an embodiment, the plate 138 can be positioned between two planes, one plane approximately coinciding with an imaging plane of the upward-viewing camera 128 and another plane approximately coinciding with an imaging plane of the downward-viewing camera 290. Thus, the fiducial mark 136 can be viewed by both the upward-viewing camera 128 and the downward-viewing camera 290 either simultaneously or at different times.

It will be appreciated that the fiducial mark 136 can be formed using several different methods. For example, the fiducial mark 136 can be printed on the plate 138 using an ink or laser printing process. Alternatively, the fiducial mark 136 can be etched into the plate 138.

While cameras 290, 128 can facilitate the recognition of reference marks to establish reference frames it will be appreciated that additional position sensors can be included in the micro device transfer tool 100 to provide feedback relating to the relative position of micro device transfer tool components. In an embodiment, a position sensor 400 can be mounted near the carrier substrate holder 108 to provide a feedback input that aids in the adjustment of the actuator assembly for stage 110. For example, the position sensor 400 can terminate in a distal end that is approximately coplanar with the holding surface of the carrier substrate holder 108. Thus, the position sensor can detect a distance to a surface relative to the carrier substrate holder 108 or the receiving substrate holder 124. For example, the position sensor can provide feedback relating to the distance between a target substrate held by the substrate holder 108, 124 and an MPA 103 attached to the articulating transfer head assembly 200 when those components are adjusted relative to each other.

Figure 8B:
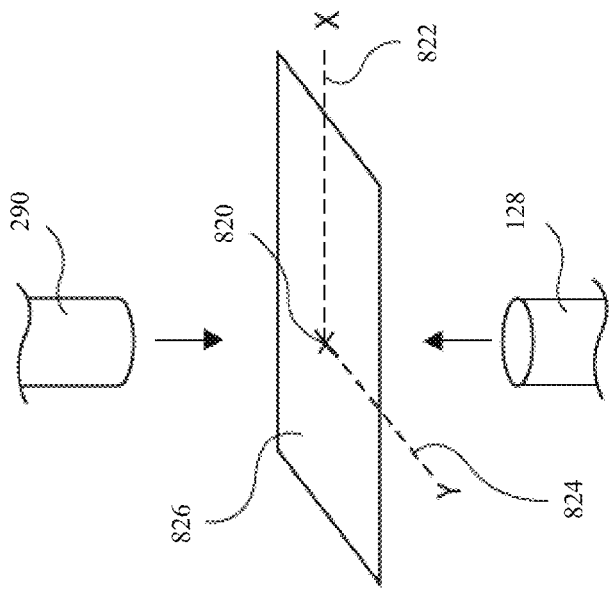
FIG. 8B is a perspective view schematic illustration of a method of setting an x-y datum in accordance with an embodiment.
Figure 8A:
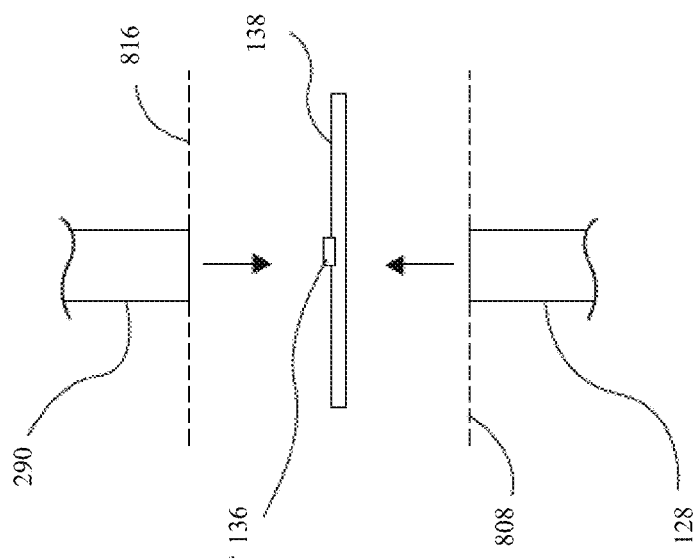
FIG. 8A is a side view schematic illustration of a method of setting an x-y datum in accordance with an embodiment.

Referring to FIGS. 8A-8B schematic side view and perspective view illustrations are provided of a method of setting an x-y datum in accordance with an embodiment of the invention. As shown, plate 138 including fiducial mark 136 is oriented between an imaging plane 808 of the upward-looking camera 128 and an imaging plane 816 of the downward-looking camera 290. When the upward-looking camera 128 and the downward-looking camera 290 view the fiducial mark 136 simultaneously, and the fiducial mark 136 is centered and focused within the respective images from the cameras, the cameras will be aligned. As shown in FIG. 8B, the fiducial mark 136 establishes an x-y datum 820 when centered and focused on simultaneously by the cameras 290, 128. Furthermore, an x-axis 822 and a y-axis 824 are determined to cross through the x-y datum 820. In an embodiment, the x-axis 822 and y-axis 824 correspond with axes of motion of stage 110 that the upward-looking camera 128 is coupled with. Furthermore, the x-axis 822 and the y-axis 824 define an x-y plane 826, which passes through the x-axis 822, y-axis 824, and x-y datum 820. Thus, a frame of reference having an x-axis 822 and an x-y plane 826 can be established according to the methods described above.

Thus, in this position, the fiducial mark 136 becomes a reference point from which movement of either the upward-looking camera 128 or the downward-looking camera 290 can be compared to determine the relative position of the cameras in a plane parallel to the imaging planes. In an embodiment, when the upward-looking camera 128 is fixed relative to a target substrate holder and the downward-looking camera 290 is fixed relative to the articulating transfer head assembly 200, the fiducial mark 136 becomes a reference point from which movement of the articulating transfer head assembly 200 or the target substrate holder can be compared to determine the relative position of those components in an x-axis and y-axis direction.

Following establishment of the x-y datum, a z-datum can be established for the frame of reference. Once the z-datum 920 is established, along with the x-axis 822 and x-y plane 826, a frame of reference is known for moving components of the micro device transfer tool 100. Prior to doing so, the bottom (mounting) surface 281 of the mounting plate 280 can be made parallel to the x-y plane 826. To do so, the upward-looking position sensor 400 can detect a distance to two or more points on the bottom surface 281, the z-gauge 910, or any other structure that is known to be parallel to the bottom surface 281. The articulating transfer head assembly 200 can then be tipped and tilted and translated until the distances to the various measured points are the same distance from the upward-looking position sensor 400. When this occurs, the bottom surface 281 can be orthogonal to the direction of detection of the upward-looking position sensor 400, and thus, the bottom surface 281 is approximately parallel to the x-y plane 826. Once the bottom surface 281 is oriented parallel to the x-y plane 826, a z-datum can be established.

Figure 8C:
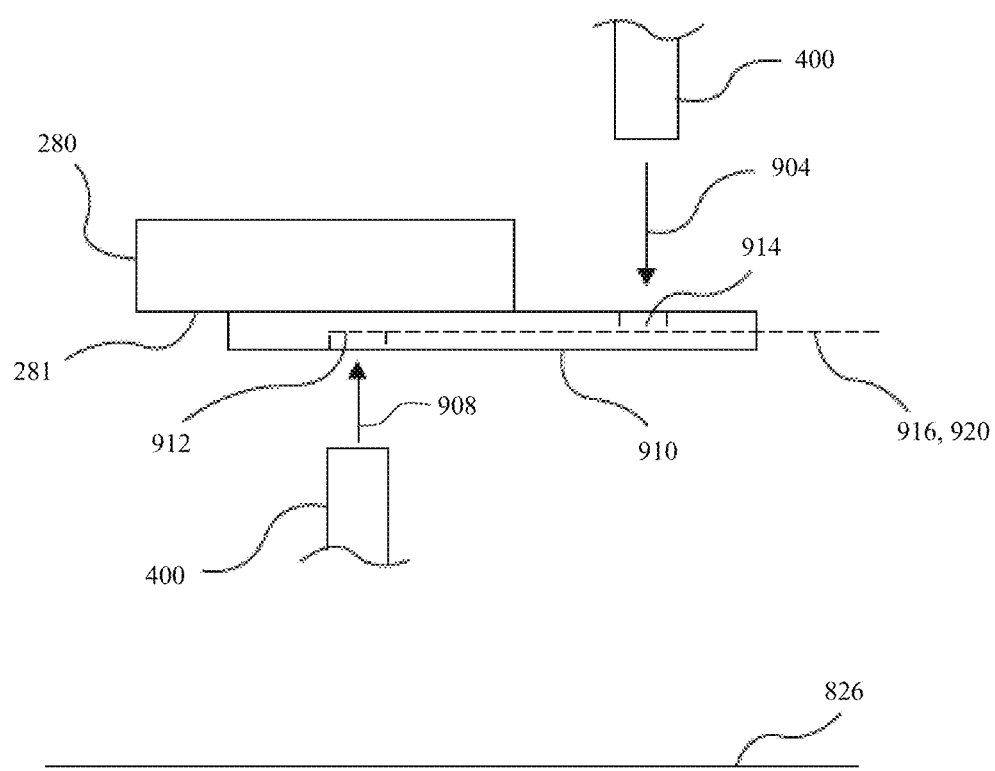
FIG. 8C is a side view illustration of a method of setting a z-datum in accordance with an embodiment.

Referring to FIG. 8C, a side view illustration of a method of setting a z-datum is shown in accordance with an embodiment. A downward-looking position sensor 400 is viewing in a downward direction 904 toward the x-y plane 826 of the frame of reference. Simultaneously, an upward-looking position sensor 400 is viewing in an upward direction 908 opposite to the downward direction. Thus, the directions of the upward and downward-looking position sensors 400 are approximately parallel with each other and can be approximately orthogonal to the x-y plane 826. The position sensors can be a variety of sensors capable of determining absolute distance to an object, such as a spectral-interference laser displacement sensor or light guide displacement sensor.

A z-gauge 910 can be releasably attached to the mounting plate 280 of the articulating transfer head assembly 200 and positioned between the upward and downward-looking position sensors 400. For example, the z-gauge 910 can be a permanent fixture that is rotated into place during alignment, or releasably attached. The z-gauge 910 can be referred to as a "z-gauge" because it is used to establish a z-datum in a frame of reference. In an embodiment, in order to establish the z-datum, the upward-looking position sensor 400 senses a distance to a first surface 912 and the downward-looking position sensor 400 can sense a distance to a second surface 914 of the z-gauge 910. These surfaces can be, for example, the base of two counterbores, formed in an outer surface of the z-gauge 910. The counterbored first and second surfaces 912, 914 can be made coplanar with each other and a surface plane 916. For example, in an embodiment, the z-gauge 910 can be formed from two silicon wafers having through holes. When aligned, given that the first and second surfaces 912, 914 are coplanar, the surface plane 916 can be established as the z-datum 920 in this orientation, and the distance to the z-datum 920 can then be measured using either the upward-looking position sensor 400 or the downward-looking position sensor 400. In an embodiment, the z-gauge 910 can be formed such that the surface plane 916 is within about 100 micrometers of a location that coincides with a contact surface of the MESAs 115.

In the foregoing discussion with regard to FIGS. 7-8C structures and methods have haven described and illustrated for establishing a frame of reference which can be used for operation of the micro device transfer tool 100, as well as for alignment of additional components, such as the MPA 103. Furthermore, the MESAs on an MPA 103 may be co-located with the remote tipping and tilting centers 622, 722 within the frame of reference so that the MESAs experience pure tipping and tilting and remain in the same lateral location, rather than shifting under parasitic translation and potentially smearing a corresponding micro device on a target substrate surface. It will be appreciated that various components of the micro device transfer tool can be heated during the pick and place sequences. For example, in an embodiment, the pivot mount assembly 300 supporting the MPA 103 and/or mounting plate 280 can be heated to a temperature range of about 100 to 350 degrees Celsius during any of the pick and place operations or alignment operations.

Figure 9:
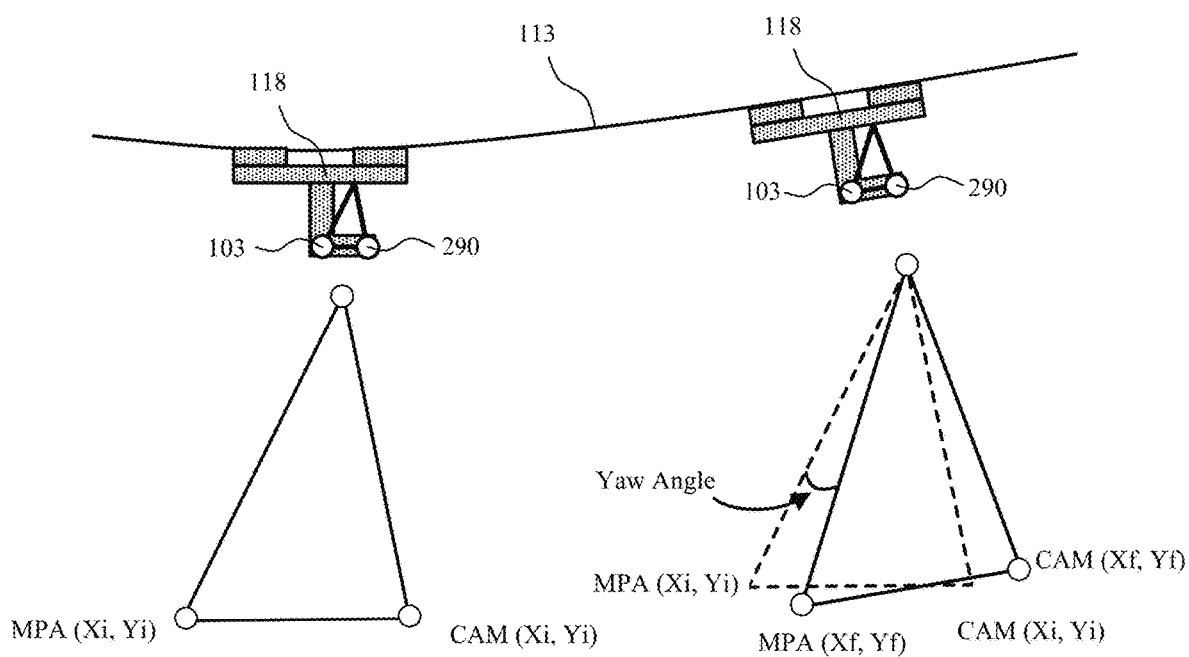
FIG. 9 is a schematic illustration of a micro device transfer tool with an x-axis translation track with a non-zero curvature in accordance with an embodiment.

Referring now to FIG. 9, the articulating transfer head assembly 200 including the downward facing camera(s) 290 can be translated, for example along an x-axis track, between carrier (donor) substrate holder 108 and receiving (display) substrate holder 124 during a pick and place sequence. The x-axis can have a curvature that is non-zero, on the order of arc seconds. The source of this curvature can be both static (e.g. from manufacturing imperfections) and dynamic (such as those from thermal expansion). It has been observed that any curvature introduces a rotational or yaw component to the articulating transfer head assembly 200 as it moves from one position to another position. In particular, FIG. 9 illustrates an initial MPA location MPA (Xi, Yi) and initial camera location CAM (Xi, Yi). Upon translation to a final MPA location MPA (Xf, Yf) and final camera location (Xf, Yf) a yaw angle (γ) is introduced which results in a change in offset between the MPA and camera with respect to the frame of reference (corresponding to the global x-y coordinate system). This change in offset is a position error with x and y components, error x (Ex) and error y (Ey), respectively. As can be surmised from the interposed positions at the final location, a larger fixed distance between the MPA and camera (CAM) results in a larger position offset after the introduction of the yaw angle.

Error can be calculated as follows, given an x component of offset from camera to MPA ($D_x$) and a y component of offset from camera to MPA (Dr) represented by:

$$(D_x) = CAM_{Xf} - MPA_{Xi} \quad (1)$$

$$(D_y) = CAM_{Yf} - MPA_{Yi} \quad (2)$$

with magnitude of offset from camera to MPA represented by the length of the hypotenuse of the right triangle whose orthogonal sides are components $D_x$ and $D_y$:

$$D = \mathrm{sqrt}(D_x^2 + D_y^2) \quad (3)$$

With this basis, the error x ($E_x$) and error y ($E_y$) can be calculated as follows:

$$E_x = D_x - D\cos\left(\tan^{-1}\left(\frac{D_y}{D_x}\right) + \gamma\right) \quad (4)$$

$$E_y = D_y - D\sin\left(\tan^{-1}\left(\frac{D_y}{D_x}\right) + \gamma\right) \quad (5)$$

However, error due to change in curvature caused by dynamic sources cannot be compensated without remapping the frame of reference. Such frequent remapping may be unsuitable for mass transfer sequences at high transfer rates. In one aspect of the embodiments described herein, it has been observed that the magnitude of x-y error is directly proportional to the distance (in x and y) between the MPA 103 and the downward facing camera 290. Hence, reducing the fixed distance between the MPA and camera (CAM) results in a reduction of error. To put into perspective, mass transfer sequences of micro devices of maximum dimensions on the order of several to tens of microns may necessitate a reduction of such error to an order of nanometers as opposed to microns. In accordance with embodiments the downward facing camera 290 is mounted inside the piezoelectric stage assembly 250 and extends through an opening in a bottom surface of the mounting plate 280 in order to locate the downward facing camera 290 as close as practical to the MPA 103 center. Thus, the camera 290 is located within the articulating transfer head assembly 200, which may have six degrees of motion. This may be facilitated by an unconventional miniaturized camera design in which the optical lenses may have a diameter less than 5 mm, for example, and a working distance of greater than 500 μm, for example. In an embodiment, the camera outermost focal lens is located (laterally) less than an inch from a center of the MPA.

In accordance with embodiments, location of the camera may additionally be facilitated with a low-CTE (coefficient of thermal expansion) structure to which both the MPA 103 and camera 290 are mounted. This reduces dynamic offset error due to thermal expansion. Further, such a mount is impractical for conventional microscopes due to size.

In an embodiment, the camera 290 is used to find and maintain alignment to a target substrate during pick and place. In one embodiment, the camera 290 can be mounted on its own z-stage, which would allow the camera to move independently of the MPA 103 during pick and place. Such an arrangement can allow the camera 290 to maintain focus at a working distance even as the MPA is moved from a distance from the target substrate to contact with the substrate (for pick and place) and then moved back to a distance from the substrate.

As previously indicated, once the frame of reference is established various system components can be aligned with the frame of reference, and to one another. For example, the upward facing cameras can be used to align an MPA 103 to a reference location within the frame of reference. Additionally, downward facing cameras and position sensors can be used to align target substrate (e.g. donor substrates, or receiving substrates) with a reference location within the frame of reference. Encoders may also be utilized to align substrates to one another, such as aligning an MPA 103 with a donor substrate or a receiving substrate (e.g. display substrate).

In one aspect, an embodiment of an MPA alignment encoder facilitates positional alignment between an MPA and a target substrate on a scale ranging from one nanometer to one micron. Positional alignment may refer to relative positioning along axes of a plane. By positionally aligning an MPA and target substrate, a reference location may be established with the MPA alignment encoder, and a distance between the MESAs and a target location on a target substrate may be calculated. Thus, the MESAs be moved into alignment with the target location, e.g., a micro device.

In accordance with embodiments the camera(s) 290 can be used to align the articulating transfer head assembly 200 and MPA 103 with a target substrate. In an embodiment, a micro device transfer tool 100 includes a carrier substrate holder 108, a receiving substrate holder 124, and an articulating transfer head assembly 200 that is translatable along an x-translation direction between the carrier substrate holder 108 and the receiving substrate holder 124. The articulating transfer head assembly 200 may include a mounting plate 280, and one or more cameras pointing away form the bottom surface 281 of the mounting plate 280. For example, the one or more cameras 290 can be mounted within the piezoelectric stage assembly 250 and extend through one or more openings 282 in the bottom surface 281 of the mounting plate 280 as previously described. Each camera 290 may be secured at a location offset in a direction relative to a center of the mounting plate 280, for example.

FIG. 10A is an exemplary schematic bottom view illustration of a bottom side of mounting plate 280 of the articulating transfer head assembly 200. As shown a pair of x-y offset cameras 290 may be located along x,y axes, with the x-axis being parallel to an x-translation direction between a carrier substrate stage and donor substrate stage (illustrated as the arrow between FIGS. 10A-10B). FIG. 10B is a schematic top view illustration of a pair of corresponding x-y offset alignment features 1152 in a display area 1150 of a target substrate offset from a place area 1155. In accordance with embodiments, the alignment features 1152 are offset from the place area 1155 with the same x,y offset as the cameras 290 are offset from the MPA 103 active area. As illustrated in FIG. 10C, the MPA 103 can then be aligned with the target place area 1155 by aligning the one or both cameras 290 with one or both of the alignment features 1152.

In the particular embodiments illustrated, the cameras 290 are illustrated as being in a direction (e.g. x-direction, or y-direction) relative to a center 296 of the mounting plate 280 and/or MPA 103. For example, the x-direction may be parallel to, or along the same axis as the x-translation direction between the carrier substrate stage and donor substrate stage. Alternatively, the cameras 290 may be located at other pre-determined x,y offset locations including both x,y components. Likewise, the corresponding alignment features 1152 can be located at corresponding locations that are offset from the center 1156 of a place area 1155 on the target substrate, which may include an array of such place areas 1155, centers 1156, and corresponding alignment features 1152.

In an embodiment, an alignment method for the MTT 100 includes translating an articulating transfer head assembly 200 over a place area 1155 of a target substrate. The articulating transfer head assembly 200 can include an MPA 103 including an array of transfer heads (e.g. MESAs 115), a first camera 290 offset from a center 296 of the MPA 103 in a first direction (e.g. x-direction) and pointing away from the MPA 103 (e.g. toward the target substrate), and a second camera 290 offset from the center 296 of the MPA 103 in a second direction (e.g. y-direction) and pointing away from the MPA 103 (e.g. toward the target substrate). At least one of the cameras 290 can then be aligned with one or more alignment features 1152 of the target substrate. This may facilitate aligning the array of transfer heads (e.g. MESAs 115) with corresponding target locations in the place area 1155 on the target substrate.

In accordance with embodiments when the MPA 103 active area is positioned at a place area 1155 there can be at least one alignment feature 1152 at a substantially equal offset position that is the same offset position of at least one of the cameras 290. For example, this may be at an x-offset position, y-offset position, or some combination of x-y offset. In the particular embodiment illustrated in FIG. 10C the pair of cameras 290 is aligned with corresponding pair of alignment features 1152 in the same display area 1150. However, this may not always be possible to have multiple alignment feature 1152 offsets at a given place area 1155 due do display area 1150 constraints. Thus, including more than one possible offset position of an alignment feature 1152 for each place area 1155 helps ensure that at least one of the cameras 290 would have an alignment feature 1152 in view. For example, when placing at the extreme x edge of a display area 1150 it may not be possible to have an alignment feature also offset in x, but still possible to have an alignment feature that is offset in y, and vice versa. It is also possible that corresponding alignment features may be within the same display area 1150 as the place area 1155, or the alignment feature may be within a neighboring display area 1150.

Figure 10D:
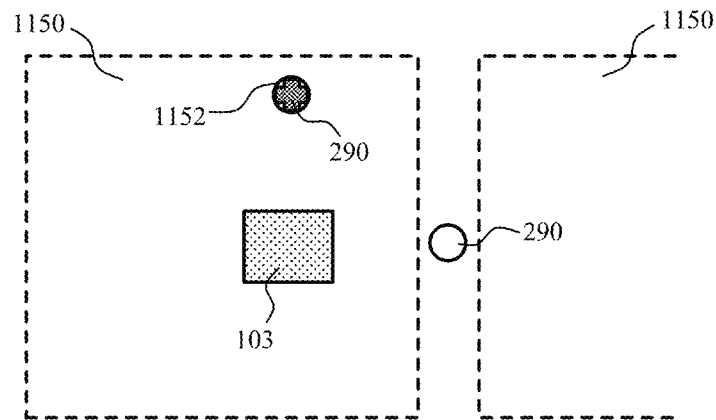
FIG. 10D is a schematic top-down illustration of no corresponding x-offset alignment feature in accordance with an embodiment.
Figure 10E:
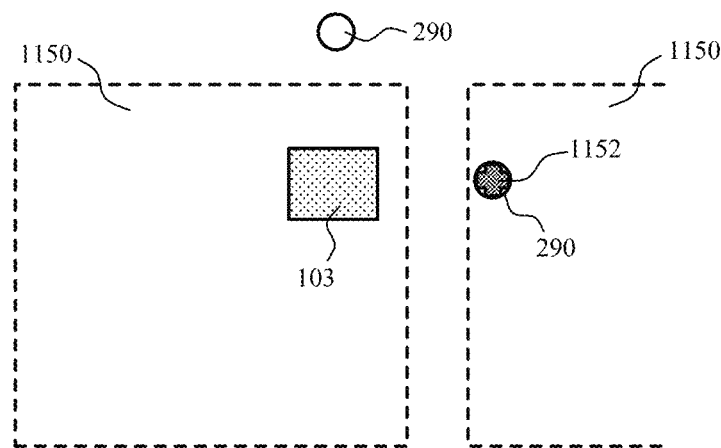
FIG. 10E is a schematic top-down illustration of no corresponding alignment features in the target display area in accordance with an embodiment.
Figure 10F:
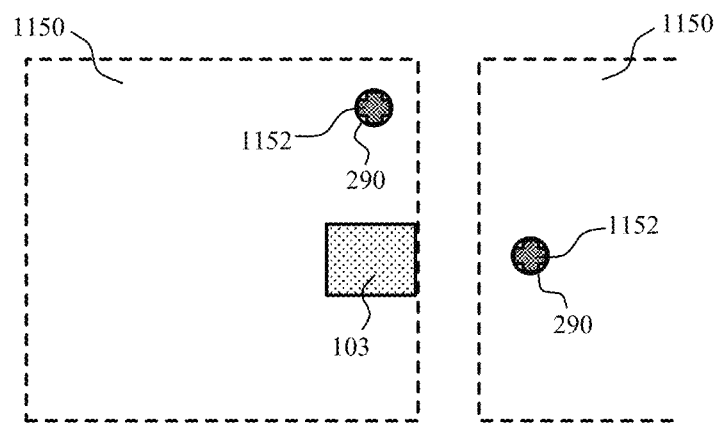
FIG. 10F is a schematic top-down illustration of using an offset alignment feature from the target display area and an offset alignment feature from an adjacent target display area in accordance with an embodiment.

FIG. 10D is a schematic top-down illustration of no corresponding x-offset alignment feature in accordance with an embodiment. In this circumstance, only one of the cameras 290 may be used for alignment. Similarly, only one of the cameras 290 would be used for alignment if there were no corresponding y-offset alignment feature available. FIG. 10E is a schematic top-down illustration of no corresponding alignment features in the target display area 1150 in accordance with an embodiment. In this circumstance, only one of the alignment cameras 290 is aligned with an alignment feature 1152 from an adjacent display area 1150. FIG. 10F is a schematic top-down illustration of using an offset alignment feature from the target display area and an offset alignment feature from an adjacent target display area in accordance with an embodiment. In this circumstance, one or both cameras may be used for alignment.

In another aspect, an embodiment of an MPA alignment encoder facilitates rotational alignment between an MPA and a target substrate. Rotational alignment may refer to relative positioning about an axis orthogonal to the MPA and target substrate. In an embodiment, the rotational alignment may be determined with reference to a plurality of encoder pattern pairs in separate regions of the MPA and target substrate. Distances between the pairs may be measured and used to calculate angular alignment between the MPA and the target substrate. By establishing an estimate of angular alignment, the MPA may be rotated into alignment with the target substrate.

Figure 11:
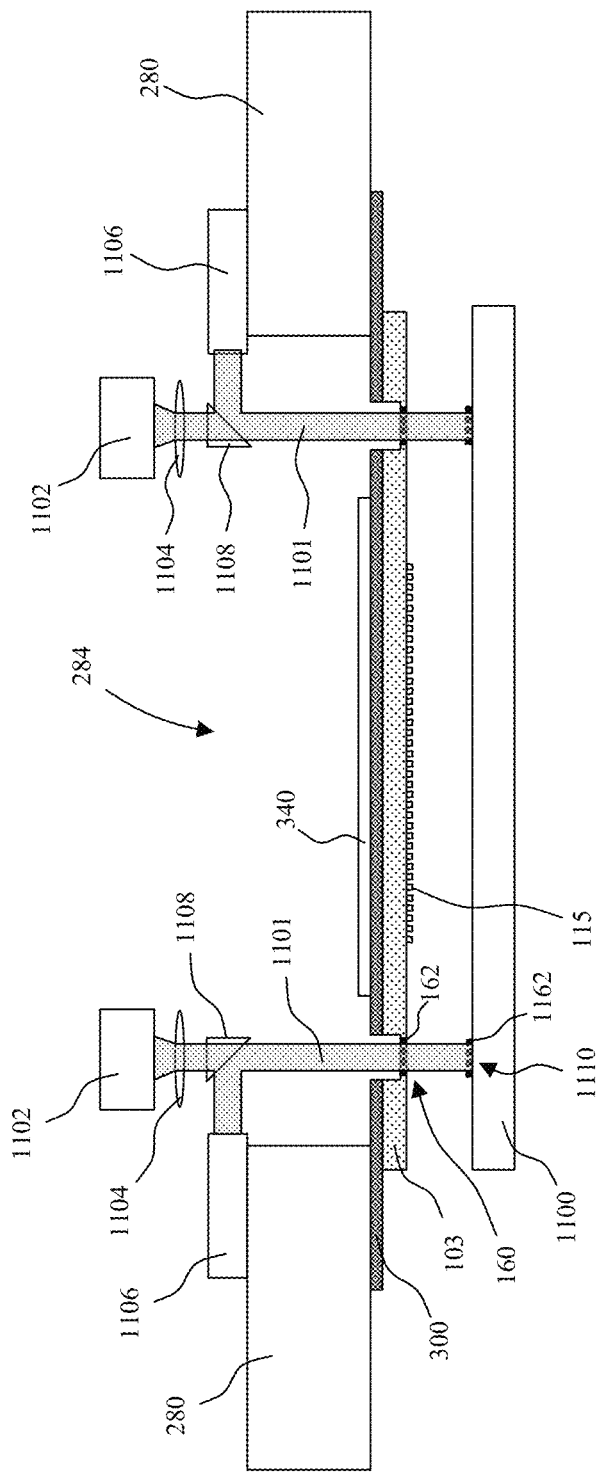
FIG. 11 is a schematic cross-sectional side view illustration of an encoder assembly in accordance with an embodiment.

Referring now to FIG. 11, a schematic cross-sectional side view illustration is provided of an encoder assembly in accordance with an embodiment. In the particular embodiment illustrated, the encoder assembly is configured for alignment of the MPA 103 with a target substrate 1100, such as a display substrate or donor substrate. As previously described a pivot mount assembly 300 can be secured to a mounting plate 280 of the articulating transfer head assembly 200, and spanning across a center-opening 284. A piezoelectric actuator element 340 (e.g. plate) may optionally be secured on a back side of the pivot mount assembly 300 to control bending, for example, which may occur during thermal profiles. An MPA 103 can be mounted on the front side of the pivot mount assembly 300. As shown, the MPA 103 can support an array of MESAs 115.

Optics of the encoder assemblies can include one or more light sources 1106, detector arrays 1102, relay optics 1104, and beam splitters 1108. In operation, light 1101 is directed from a light source 1106 toward a beam splitter 1108 which directs the light through an encoder pattern 160 coupled to the MPA 103, and toward an encoder pattern 1110 coupled to the target substrate 1100, where the light is reflected back toward the MPA 103 (and optionally back through the encoder pattern 160), through the beam splitter 1108 and relay optics 1104 to the detector array 1102. Light 1101 may be collimated in some embodiments, or may have a slight focus to reduce diffraction ringing. Different types of encoder patterns 160, 1110 may be utilized, such as transmissive-type and reflective-type encoder patterns. In an embodiment, encoder pattern 160 is a transmissive-type which includes opaque line/ring patterns over a transparent substrate, while encoder pattern 1110 also includes light absorbing, anti-reflective line/ring patterns over a reflective substrate. Alternatively, encoder pattern can include reflective line/ring patterns over a light absorbing, anti-reflective substrate layer.

Figure 12:
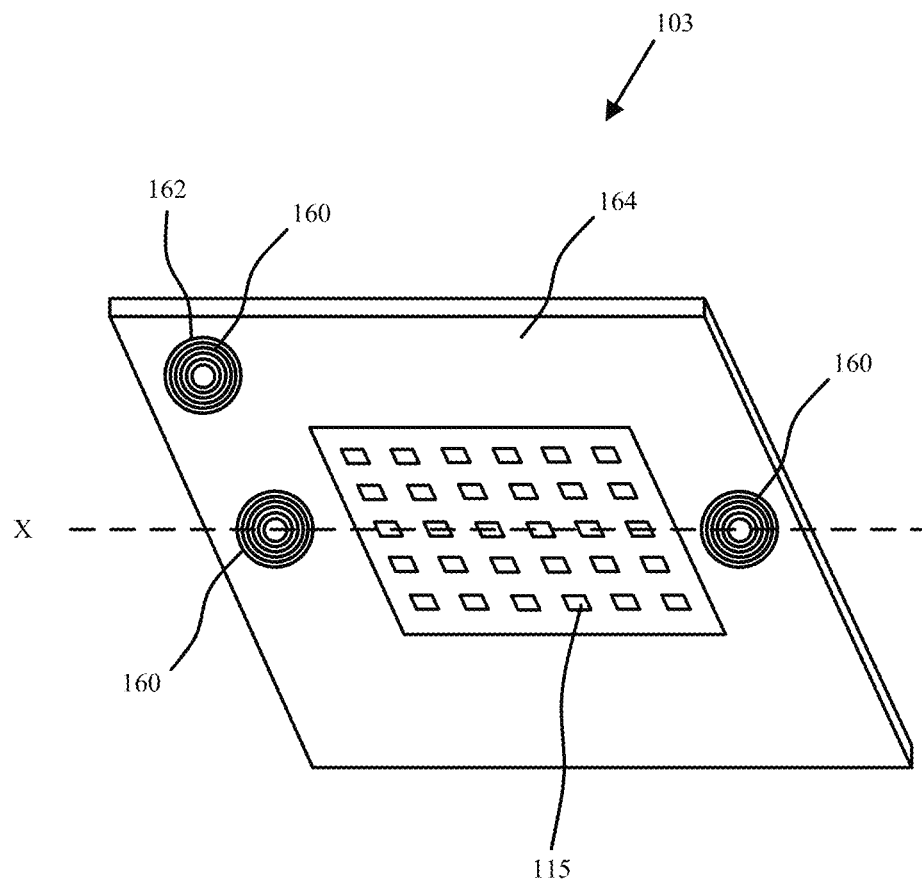
FIG. 12 is a bottom side perspective view of an MPA with multiple encoder patterns in accordance with an embodiment.

Referring now to FIG. 12, a bottom side perspective view illustration is provided of an MPA with one or more encoders in accordance with an embodiment. As shown, the MPA 103 includes an array of MESAs 115 over a central portion of a base substrate 164. One or more encoder patterns 160 with concentric grating patterns are located over the base substrate 164 at known distances form the MESAs 115. For example, encoder patterns 160 may be positioned corners or quadrants of micro MPA 103, or in a direct x-axis translation track in the micro transfer tool assembly, such as between the carrier substrate holder and receiving substrate holder when the MPA 103 is secured to the articulating transfer head assembly 200. Accordingly, once the position of encoder pattern(s) 160 are identified, the known distance to MESAs 115 may be used to calculate a position of each MESA.

Each encoder pattern 160 may be a concentric grating pattern including a plurality of rings 162 of first diameters. For example, each ring 162 may have a same line width, and be separated from a second ring by a same spacing, which may be the same as the line width. Each encoder pattern 1110 may be similarly arranged with a plurality of rings 1162 of same line width, and spacing. In an embodiment, the diameters of the rings 1162 are offset from the diameters of the rings 162, such that they are all slightly larger or smaller, which facilitates creation of the moiré patterns. For example, the offset from the diameters of the rings 1162 may be one quarter of the line width offset from the diameters of the rings 162.

In an embodiment, a micro device transfer tool alignment method includes translating a first concentric grating pattern coupled with a first substrate (e.g. MPA) over a second concentric grating pattern coupled with a second substrate (e.g. target substrate, donor substrate, display substrate), directing light 1101 through a first concentric grating pattern (e.g. encoder pattern 160) toward the second concentric grating pattern (e.g. encoder pattern 1110), detecting reflected light with a detector array 1102 divided into multiple detection zones, and determining a relative x-y position of the first and second substrates.

Figure 13:
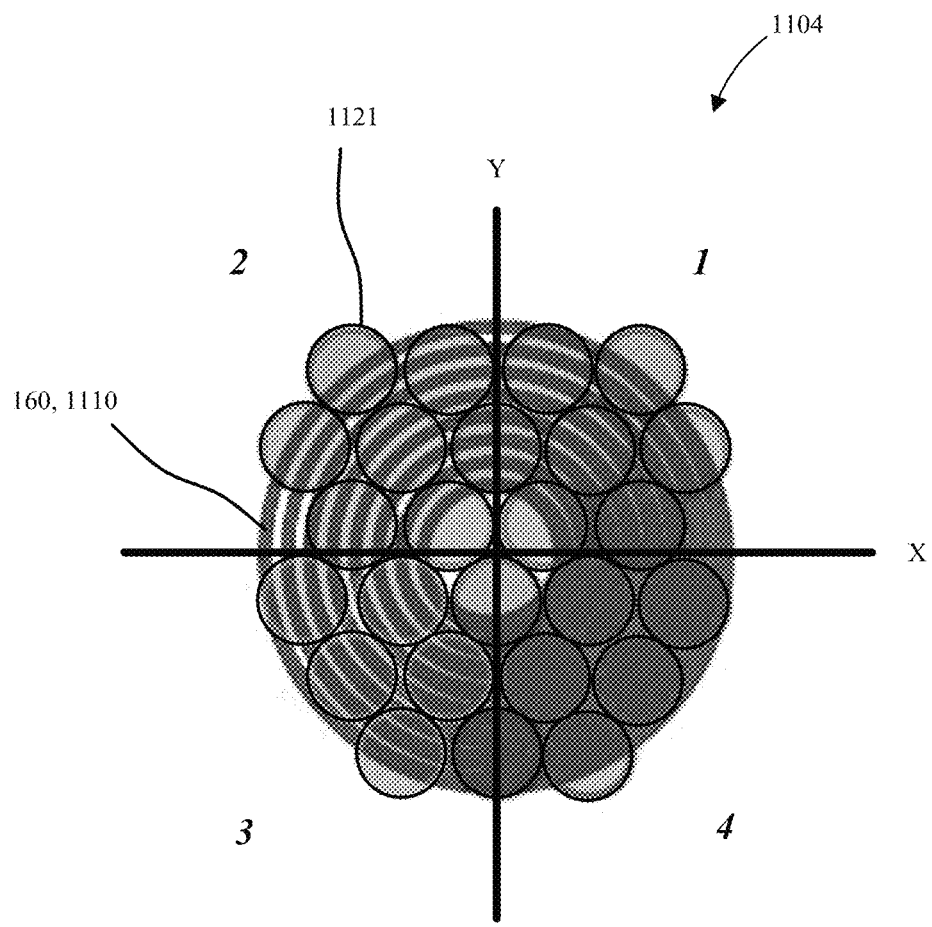
FIG. 13, a schematic top view illustration an exemplary moiré pattern superimposed over optics in accordance with an embodiment.

Referring to FIG. 13, a schematic top view illustration is provided of a resultant moiré pattern of light after passing through encoder patterns 160, 1110 toward optics 1104. As shown, the optics 1104 may be a bundle of fibers 1121 used for collection optics, which can then be routed to a corresponding photodiode array such as an array of CMOS image sensors or photodiodes. In the particular embodiment illustrates four zones, or quadrants are shown, though there may be more or less. In accordance with embodiments, the detector array 1102 measures the intensity of incident light in each of the zones. A determination of the relative x-y position is then made based on the intensity of light in each zone.

Figure 14A:
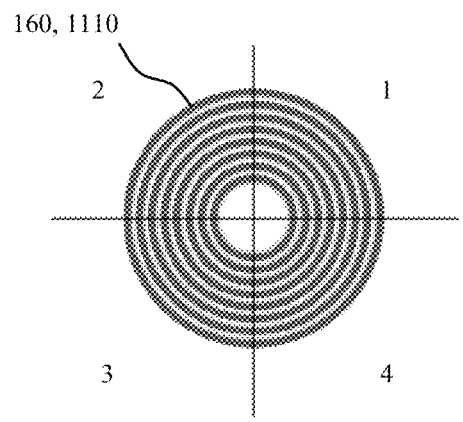
FIGS. 14A-14E are illustrations of resultant moiré patterns indicative of x-y alignment and misalignment in accordance with embodiments.
Figure 14B:
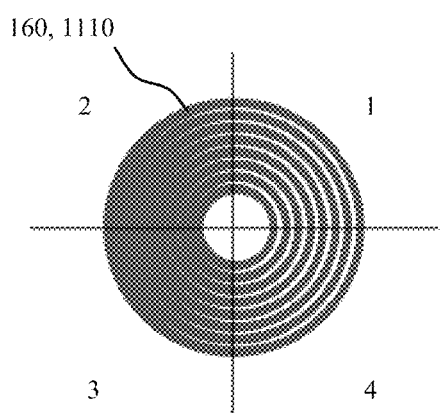
Figure 14C:
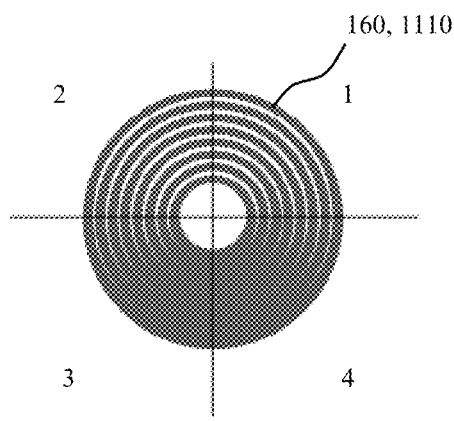
Figure 14D:
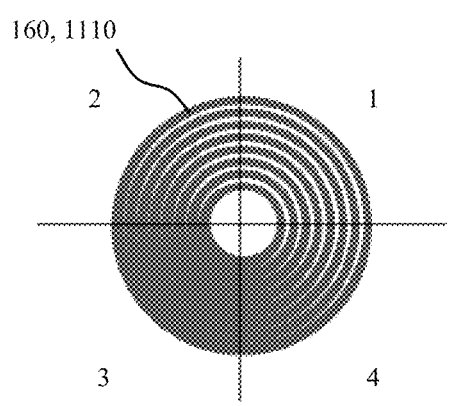
Figure 14E:
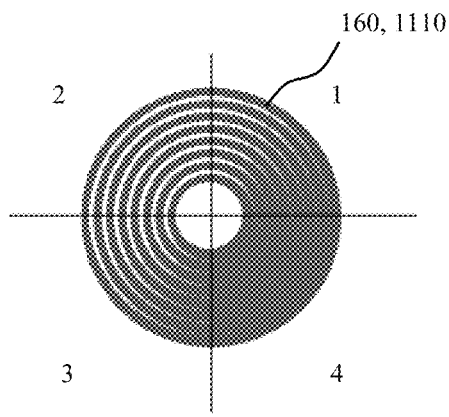

Referring now to FIGS. 14A-14E various moiré patterns are provided to illustrate how x-y alignment and misalignment can be determined in accordance with embodiments. Specifically, FIG. 14A is an illustration of aligned substrates, where the two complimentary gratings are aligned. FIG. 14B is an illustration of pure positive x-misalignment, FIG. 14C is an illustration of pure positive y-misalignment, FIG. 14D is an illustration of equal positive and an y misalignment (quadrant 1), and FIG. 14E is an illustration of negative x, positive y misalignment (quadrant 2).

Figure 15:
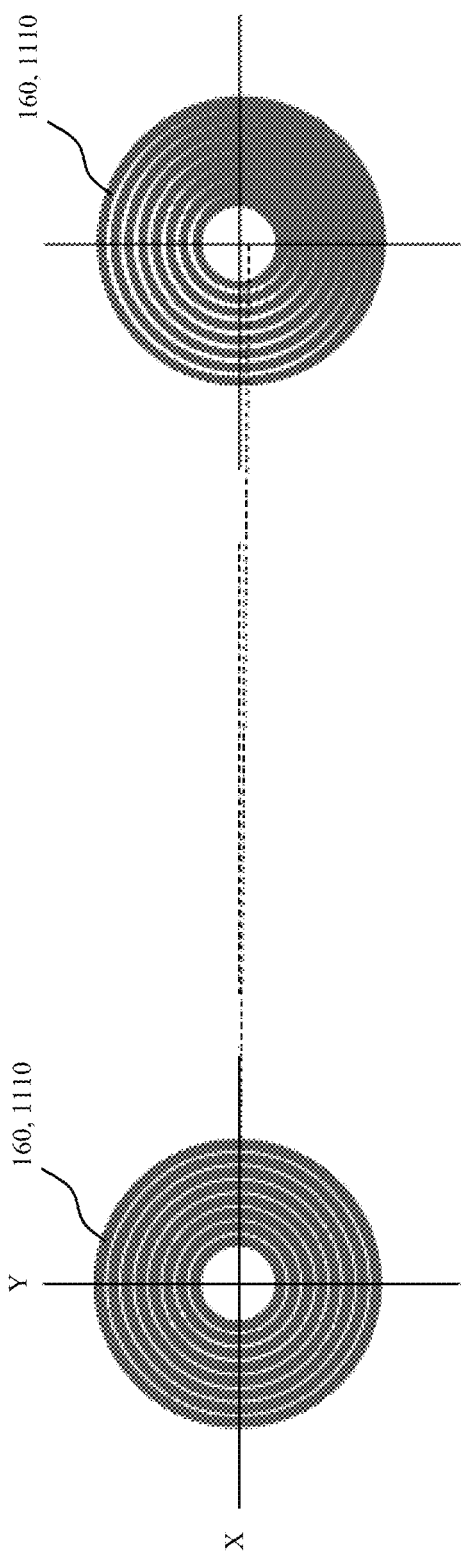
FIG. 15 is a schematic top view illustration of a pair of moiré patterns indicative of angular misalignment in accordance with an embodiment.

In some embodiments a plurality of complementary encoder patterns 160, 1110 can be used to measure in-situ angular displacement. Referring now to FIG. 15, a schematic top view illustration of a pair of moiré patterns is provided in accordance with an embodiment. As shown, the primary complementary pair of encoder patterns 160, 1110 on the left are aligned for both x and y. However, the secondary pattern for the complementary pair of encoder patterns 160, 1110 on the right side are offset with an angular misalignment. Thus, in such an embodiment, the articulating transfer head assembly 200 can be adjusted to align both complementary pairs of encoder patterns to maintain alignment during the pick and place sequences.

In yet another embodiment, the plurality of complementary encoder patterns 160, 1110 can be used to measure thermally induced error. For example, this could potentially occur during a thermal ramp cycle. Such thermally induced error would however be a "scale error" in which the pitch of the MESAs would differ from a corresponding pitch (e.g. micro devices) on a target substrate. Such a scale error can be corrected by adjusting the temperature of any of the MPA, donor substrate, or receiving substrate, all of which have independent temperature control and heater elements. This scale error can be used as historical system data for inputting parameters during micro device transfer.

In accordance with embodiments, the relative position signals (x, y, angular displacement) can be fed back into a closed-loop position servo system to maintain a relative position between the target and positioned concentric grating patterns. Determination of intensity can be image-based or non-image based. An image-based implementation may analyze the moiré fringes to determine relative positions. A non-imaged based implementation may measure integrated intensity over an area, and may possibly be performed at a faster rate. Furthermore, a fourth parameter, scale error, can also be fed into a heater control feedback loop to maintain matching pitches among the MPA and target substrates.

Referring now to FIGS. 16A and 17A, different concentric grating patterns are illustrated as being superimposed over a plurality of subpixels in a pixel area 1124 of a display substrate in accordance with embodiments. As shown, each subpixel 1125 includes a landing area 1120 which can receive a pair of redundant micro LEDs 1122. Each landing area 1120 may have a conductive landing pad area for each corresponding micro LED 1122 (which may not yet be placed). A variety of conductive or insulating layers may be located in portions of the pixel areas 1124 between the landing areas 1120. As previously described, the encoder patterns 1110 include a plurality of concentric rings (e.g. circles) 1162 defined by line widths and spacings. As shown, each ring 1162 may include a line break 1163 so as to not interfere with optics inside the landing areas 1120. In the embodiment illustrated in FIG. 16A, the line breaks 1163 are patterned to match the landing areas 1120. In the embodiment illustrated in FIG. 17A the line breaks 1163 are made along entire display rows of subpixels. It is to be appreciated that these two configurations are exemplary, and embodiments are not limited to these two particular configurations. FIGS. 16B and 17B are schematic top view illustrations after the complementary encoder (grating) pattern 160 is aligned over the encoder pattern 1110 (e.g. grating pattern). As shown, characteristic moiré patterns are created despite the line breaks.

In an embodiment, a display includes a target (display) substrate 1100 including a pixel area and a non-pixel area. One or more concentric grating patterns (encoder pattern 1110) is on the target substrate 1100. The concentric grating pattern can be located in the pixel area or the non-pixel area. When located in the non-pixel area, the concentric grating pattern can be superimposed over a plurality of subpixels in the pixel area. In some embodiments, the concentric grating pattern is patterned to include a plurality of line openings directly over the LED landing areas 1120 in the plurality of subpixels.

Figure 18:
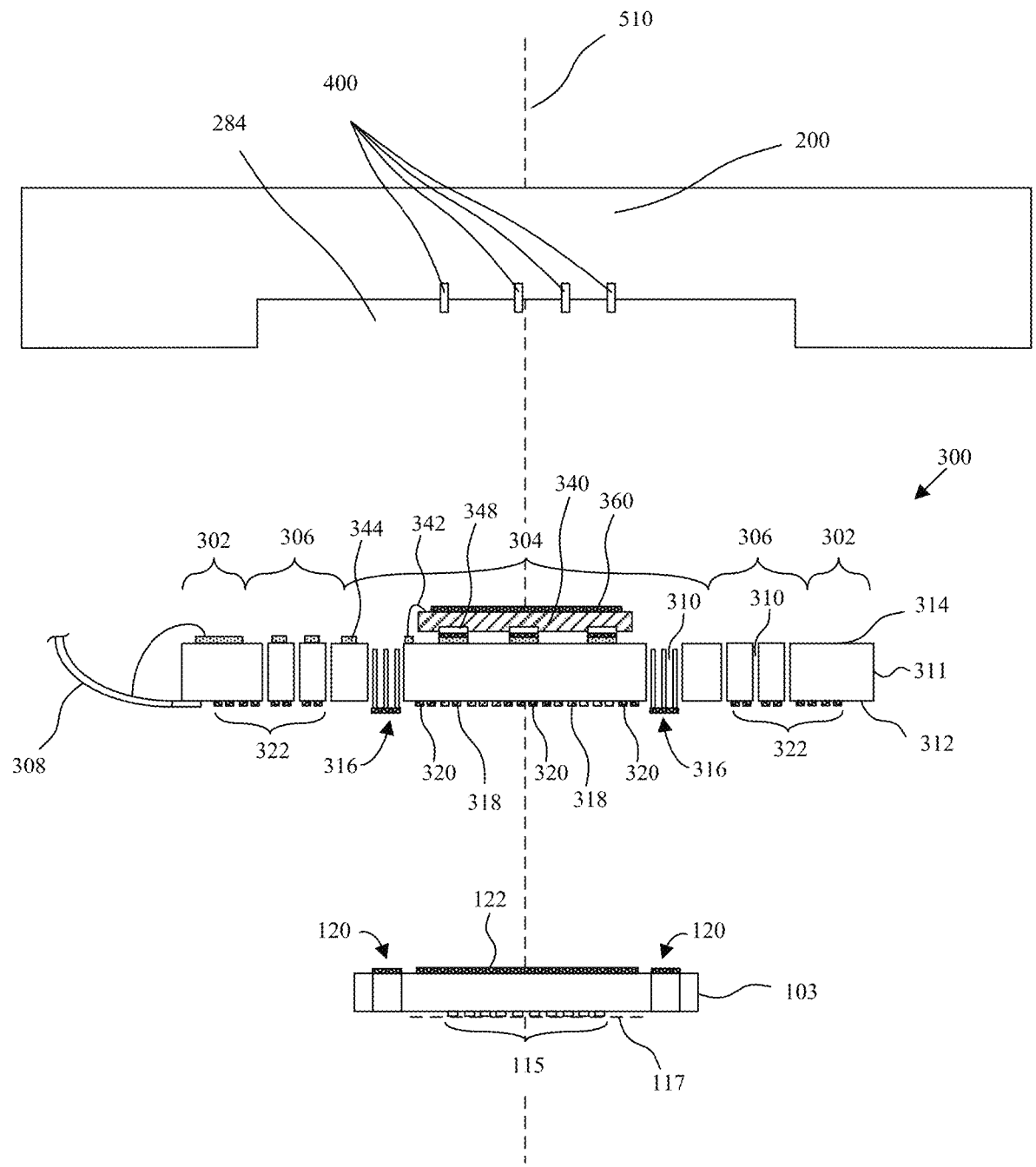
FIG. 18 is an exploded cross-sectional side view illustration of an articulating transfer head assembly, pivot mount assembly, and MPA in accordance with an embodiment.

Referring now to FIG. 18, an exploded cross-sectional side view illustration is provided of an articulating transfer head assembly 200, pivot mount assembly 300, and MPA 103 in accordance with an embodiment. Generally, the pivot mount assembly 300 is mounted onto the articulating transfer head assembly 200. This may be accomplished using a variety of manners such as using tabs or lips to press the pivot mount assembly against the articulating transfer head assembly 200, bonding, vacuum, or electrostatic clamping. Center-opening 284 may function as a deflection cavity to allow a specified z-deflection distance of the pivot platform 304 along the z-axis.

The pivot mount assembly 300 may include a base substrate 311. In an embodiment, the base substrate 311 is made from silicon using micro electrical mechanical systems (MEMS) fabrication techniques. Channels 310 may be formed through a body of the base substrate 311 from a front side 312 to back side 314. Channels 310 may be used to form a variety of compliant features of the pivot mount assembly 300, including defining the spring arms 306 and pivot platform 304, as well as compliant voltage contacts 316. The compliant voltage contacts 316 may provide a low contact resistance connection to voltage contacts 120 of the MPA 103. In the embodiments illustrated, the compliant voltage contacts 316 protrude from the pivot platform 304 such that they are raised above the pivot platform 304. Electrodes 318, 122 may be utilized to provide a voltage to electrostatically clamp the MPA 103 onto the pivot platform 304. In accordance with embodiments, the clamping pressure is sufficient to withstand thermal distortions of the structure, and physical distortions induced by a piezoelectric actuator element 340 as well as any external factors. Upon clamping the MPA 103 onto the pivot platform of the pivot mount assembly 300 with the opposing electrodes 318, 122, the compliant voltage contacts 316 exert a pressure upon the MPA voltage contacts 120. The electrodes 318 and compliant voltage contacts 316 may each include a metallic layer on the front side 312 of the base substrate 311. In an embodiment, the metallic layer of the electrodes 318 is covered by a dielectric material layer, while the metallic layer of the compliant voltage contacts 316 is exposed. Additional features may be located on the base substrate 311. For example, one or more heater elements 320 (e.g. thin film heater elements) may be located on the front side 312 of the base substrate 311. During micro device transfer, the heater elements 320 may maintain the pivot mount assembly 300 and MPA 103 at an elevated temperature relative to a target substrate. Wiring layers 322 may connect the one or more heater elements 320, and metallic layers of the electrodes 318 and compliant voltage contacts 316 to the flex circuit 308 on the front side 312 of the base substrate 311.

In the illustrated embodiment, the pivot mount assembly 300 additionally includes a piezoelectric actuator element 340 bonded to the back side 314 of the base substrate 311 to control a curvature of the base substrate 311, and resultantly, a curvature of the MPA 103 and the contact surfaces of the array of MESAs 115. In an embodiment, the piezoelectric actuator element 340 is bonded with metal-metal bonding or an adhesive (e.g. a thermoset material) to the pivot platform 304. The piezoelectric actuator element 340 may be electrically connected with the pivot mount assembly 300 using various techniques, including wire bonds 342 or bottom contacts 348 on the bottom side of the piezoelectric actuator element 340. In either configuration, the wire bonds 342 or bottom contacts 348 may be connected to electrical wiring 344 on the back side 314 of the base substrate 311. The electrical wiring 344 may additionally be electrically connected to the flex circuit 308 through additional wire bonding, or vias formed through the base substrate 311.

The surface to which the piezoelectric actuator element 340 is bonded may be opposite the side used for clamping the MPA 103. In an embodiment, the piezoelectric actuator element 340 material is lead zirconate titanate (PZT). In an embodiment, the piezoelectric material is PZT Type 5A. The bonded structure of the base substrate 311 and piezoelectric actuator element 340 together comprise a 2-layer monomorph bender in which the active layer is the piezoelectric actuator element 340 and the passive layer is the pivot platform 304 of the base substrate 311. In an embodiment, the piezoelectric actuator element 340 is poled normal to the base substrate 311 such that the d33 direction is in the "Z" direction of the structure. Because the piezoelectric actuator element 340 is bonded to the pivot platform 304, forming a monomorph bending structure, changes in voltage across the piezoelectric actuator element 340 will result in out-of-plane bending of the structure. If the piezoelectric actuator element 340 is substantially symmetric with the pivot platform 304, the out-of-plane bending will be substantially symmetric to the pivot platform (centered on the structure—the center of curvature coincides with the z-axis of the structure).

During micro device transfer, the MPA 103 may be electrostatically clamped to the pivot mount assembly 300. The clamping pressure between the MPA 103 and pivot mount assembly 300 may be between 1 and 10 atmospheres in some embodiments. It has been demonstrated that a clamping pressure of this magnitude range can be sufficient to maintain shape conformity of the MPA 103 to the pivot mount assembly 300. Hence, changes in shape in the pivot mount assembly 300 will correspond directly to a change in curvature in the MPA 103. In other words, by actively controlling the shape of the pivot mount assembly 300 it is possible to correspondingly control the shape of the MPA 103, and hence the curvature along the contact surfaces of the array of MESAs 115.

In accordance with embodiments, the shape control elements are incorporated into the articulating transfer head assembly 200 and pivot mount assembly 300. This approach may allow for active shape control of the MPA 103 without requiring new features and added cost in the MPA 103, supporting a strategy in which the MPA 103 is a consumable element in a micro device transfer manufacturing process.

Still referring to FIG. 18, in an embodiment, a plurality of contactless position sensors (e.g. displacement sensors) 400 may be aimed at a face of the monomorph bending structure, which includes the base substrate 311 and the piezoelectric actuator element 340. In accordance with embodiments, the position sensors 400 are any of the position sensors (e.g. displacement sensors) 400 described and illustrated with regard to FIGS. 21-29. Other exemplary position sensors may include the SI-F Series spectral interference laser displacement sensor from Keyence Corporation of Japan. Other types of appropriate displacement sensors include a Shack-Hartmann wavefront sensor, capacitive sensor, and inductive sensor.

In an embodiment, a position sensor 400 may be placed at a fixed reference position relative to a pivot mount assembly 300 bending structure, for example in the kinetic sensor assembly 295. The position sensor may be aimed to measure the z position of a point on the pivot mount assembly 300 bending structure. The point may be located at the axis of symmetry (e.g. along x, y, z axes) of the pivot mount assembly 300 bending structure, or may be located at a known position off-axis. In such an arrangement the position sensor will measure a change in z position at the point that is proportional to the change in the curvature of the pivot mount assembly 300 bending structure. While such an arrangement can produce a signal corresponding to the change in curvature, additional reference information about the initial shape of the pivot mount assembly 300 bending structure is utilized by an active shape control algorithm to report the measured surface profile/curvature, such as a radius of curvature, of the deformed structure.

In another embodiment, two or more position sensors 400 may be placed at fixed reference positions relative to a pivot mount assembly 300 bending structure. The fixed reference positions may be common, such as along a same radius from the axis of symmetry (along the z-axis) of the pivot platform 304. One or more of the position sensors 400 may be located near the axis of symmetry. The position sensors 400 may be aimed to measure the z positions of two or more different points on the pivot mount assembly 300 bending structure. The points may each be located at two different radii from the axis of symmetry of the pivot mount assembly 300 bending structure. In such an arrangement the position sensors may each measure a change in the z position at each of the points that is proportional to the change in the radius of curvature of the pivot mount assembly 300 bending structure. In accordance with embodiments, when the pivot mount assembly 300 bending structure is substantially flat (having zero curvature) the two or more position sensors 400 will record the same distance. This may correspond to calibrated values of the position sensors so that their measurements are referenced to a truly flat state. As the curvature of the pivot mount assembly 300 bending structure changes, the position sensors 400 will record different positions. In an embodiment, using these displacement values at each of the points and knowing the position of each of the points relative to the axis of symmetry, it is possible to calculate the equation of a sphere whose center lies on the axis of symmetry and whose surface corresponds to the surface of the pivot mount assembly 300 bending structure, and, by extension, the face of the MPA 103 (e.g. the contact surface 117 of the MESAs 115). From this equation, the radius of curvature of the face of the MPA 103 (e.g. contact surface 117) can be known.

In an embodiment, one or more mirror patterns 360 are formed on the back side of the piezoelectric actuator element 340, and vertically aligned with the one or more position sensors 400. In this manner, the reflective mirror pattern 360 can aid signal integrity. In an embodiment, the one or more mirror patterns 360 are formed of a reflective material (e.g. gold), and may have an average surface roughness, Ra, of 2,000 Angstroms or less. The one or more mirror patterns 360 may be formed on the back side of the base substrate 311 in addition to, or alternatively to the back side of the one or more piezoelectric actuator elements 340.

In an embodiment, three or more position sensors 400 are arranged at a common radius from the axis of symmetry of the pivot platform 304 and an additional position sensor 400 is located near the axis of symmetry. Using this arrangement information about the rotation of pivot mount assembly 300 about the x axis, rotation of the pivot mount assembly 300 about the y axis, displacement of the pivot mount assembly 300 in the z direction, and curvature of the pivot mount assembly 300 are obtained. Incorporation of a larger array of position sensors 400 may be deployed to obtain more complex topography information.

Figure 19:
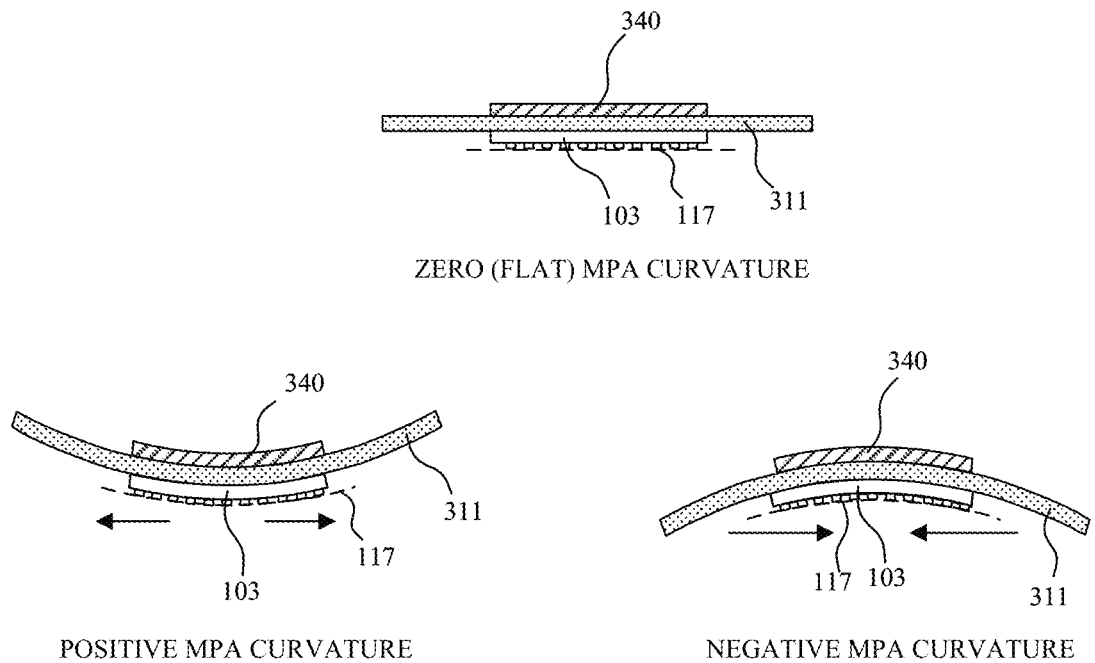
FIG. 19 is a schematic cross-sectional side view illustration of pivot mount assembly curvature in accordance with embodiments.

During a transfer sequence in accordance with embodiments there may be large thermal differentials at the contact interface between the MPA 103 and the target substrate (e.g. donor substrate or receiving substrate). For example, pre-contact thermal differentials can be on the order of 200° C. between the MPA 103 and the target substrate. This can result in a thermal gradient from the front side of the MPA 103 to the back side of the pivot mount assembly 300 at the time of initial contact. This gradient can result in a thermal-strain-induced curvature of the MPA 103, which would otherwise be flat when the thermal gradient is zero. As illustrated in FIG. 19, such curvature may be positive (concave up) or negative (concave down), depending on the conditions. Out-of-plane curvature in the MPA 103 may be on the order of microns deviation from flat in some embodiments.

In accordance with embodiments, the change in curvature of the pivot mount assembly 300 may be measured directly during pick and place operations and simultaneously correlated to the changing temperature gradient during the transfer process. Results from experimentation, analysis, and simulation demonstrate that the expected shape change in the MPA 103 and pivot mount assembly 300 structure may be dominated by plate bending. This is because the magnitude of the thermal gradient in the MPA and pivot mount assembly structure can be greatest in the Z dimension. Further, results show that the most common manifestation of the shape change may be out-of-plane bending that is substantially constant in radius (spherical) and rotationally symmetric about the center of the pivot mount assembly 300 pivot platform 304 (along the z-axis).

A pick and place operation in accordance with embodiments may include a temperature profile of the pivot mount assembly in accordance with embodiments. Different elevated temperatures may be associated with the MPA contacting an array of micro devices on a donor substrate, translating the MPA from a location over the donor substrate to a location over a receiving substrate, contacting the MPA with the receiving substrate, and removing the MPA from the receiving substrate and translating back toward a position over the donor substrate. Thermal disturbances and physical strain inducing moments (e.g. during contact, or disengaging) may occur at various periods during the transfer sequence resulting in a change in curvature of the MPA, and correspondingly the curvature of the pivot mount assembly 300. In accordance with embodiments, the bending assembly may have a corresponding unique curvature with each temperature or strain inducing moment, and the active shape control system addresses this by countering the thermally induced and physically induced strain.

Figure 20:
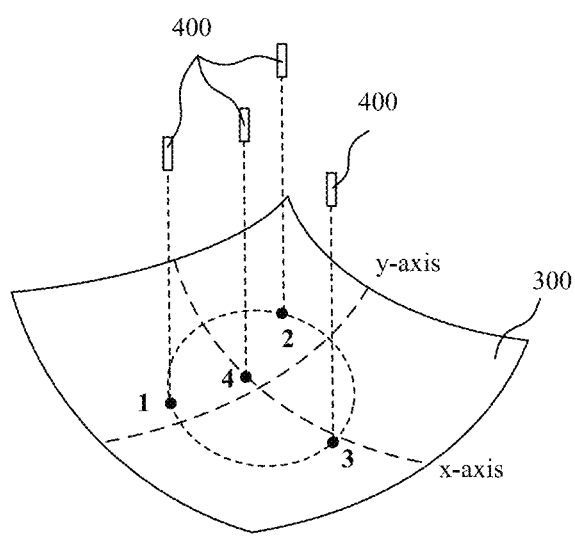
FIG. 20 is conceptual illustration of a method of determining a shape-fitting feedback signal in accordance with an embodiment.

FIG. 20 is conceptual illustration of a method of determining a shape-fitting feedback signal in accordance with an embodiment. In the particular embodiment illustrated, four position (e.g. displacement) sensors 400 are arranged to measures a distance in the z direction to either of the base substrate 311 or piezoelectric actuator element 340. As shown, position sensors 1-3 may be at (x, y) positions not in a straight line, for example a circle. In an embodiment, the position sensors 1-3 are equally spaced along a circle concentric to the center axis of the piezoelectric actuator element 340. The fourth position sensor may be at an (x, y) position that is not along the radius of the circle. For example, the fourth position sensor may be located a known distance from the center axis. In accordance with embodiments, multiple position sensors 400 measure a distance to the target at each sensor location, resulting in the array of points (x1, y1, z1), (x2, y2, z2), (x3, y3, z3), (x4, y4, z4) which are input into a shape fitting algorithm. The shape fitting algorithm can use various methods for defining the shape.

In an embodiment, the shape filling algorithm can calculate an equation of a sphere defined by the four points, and output a measured radius of curvature based on a best-fit sphere calculation. This measured radius of curvature (i.e. measured MPA shape) can be compared against a reference (e.g. desired MPA radius of curvature) with the active shape control algorithm which outputs an error signal to an amplifier that then applies one or more gain values to the error signal and adjusts its output voltage to the piezoelectric actuator element 340 in response to the error signal. In accordance with embodiments, this may cause the piezoelectric actuator element 340 to flatten the measured radius of curvature.

In an embodiment, the shape filling algorithm can calculate an equation of a plane defined by the first three points, and additionally calculate an offset of the distance between the plane and the fourth point (x4, y4, z4). The control loop in accordance with embodiments, functions to reduce the offset, with the flat state corresponding to a zero offset value. The measured offset (i.e. measured MPA shape) can then be compared against a reference (e.g. zero value corresponding to a flat state) with the active shape control algorithm, which outputs an error signal to the amplifier that then applies one or more gain values to the error signal and adjusts its output voltage to the piezoelectric actuator element 340 in response to the error signal (e.g. to drive the offset to zero).

Referring now to FIGS. 21-29, in accordance with some embodiments, the position sensors 400 may be formed from an arrangement of light guides. In some embodiment, the position sensors 400 may be displacement sensors used for measurement of absolution distance in various process control and/or calibration functions. In some aspects, the position sensors 400 may be packaged in a manner to fit within limited available space within the micro device transfer tool 100 where other sensors would be too large. The position sensors 400 may additionally include various structural features that can mitigate drift, including rigid light guides to mitigate drift due to flexing, and packaging considerations such as photodiodes being mounted on opposite sides of a circuit board to mitigate thermal drift. Furthermore, integration of photodiodes for intensity measurements in accordance with embodiments may further facilitate the ability for higher speed measurements, such as on the order of 10-300 kHz or even as high as the MHz range. This may be higher than available with commercially available laser displacement sensors that use image sensors or linear sensor arrays, which take more time to read and result in lower measurement speed, such as on the order of 1 kHz or lower.

Figure 21:
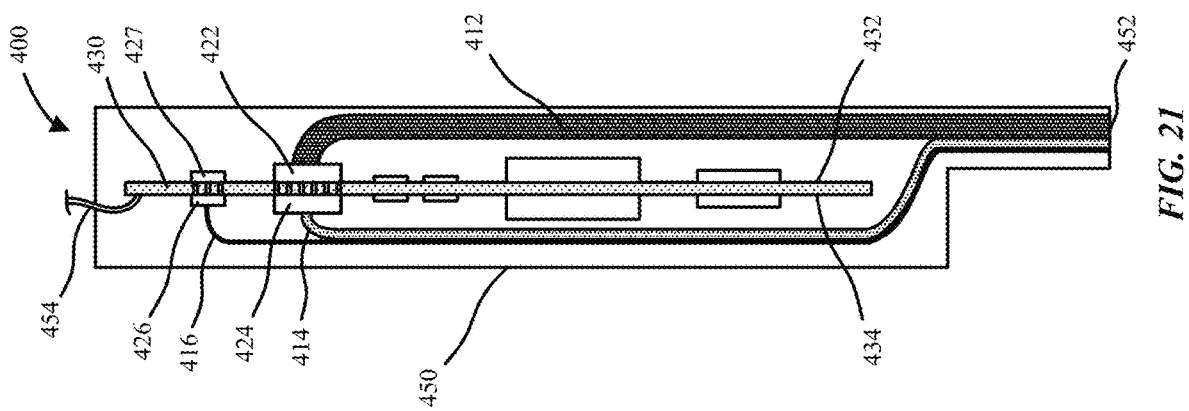
FIG. 21 is a schematic cross-sectional side view illustration of a position sensor in accordance with an embodiment.

FIG. 21 is a schematic cross-sectional side view illustration of a position sensor 400 in accordance with embodiments. In an embodiment, a position sensor 400 includes a light source 426, such a light emitting diode (LED), and a light source light guide 416 (which may optionally be a fiber) including a proximal end adjacent the light source 426 and a distal end adjacent a guide tip 452. The position sensor 400 additionally includes a first photodiode 424, and a first rigid light guide 414 including a proximal end adjacent the first photodiode 424 and a distal end adjacent the guide tip 452, as well as a second photodiode 422, and a second rigid light guide 412 including a proximal end adjacent the second photodiode 422 and a distal end adjacent the guide tip 452. In this arrangement, the distal ends of the light source light guide 416, first rigid light guide 414 and the second rigid light guide 412 are all substantially coplanar at the guide tip 452. Additionally, the rigid light guides 414, 412 may be entirely rigid between their proximal and distal ends. The light source light guide 416 may optionally be rigid, or may optionally be flexible (e.g. flexible optical fiber).

In an embodiment, the first photodiode 424 and the second photodiode 422 may be mounted on laterally opposite sides 434, 432 of a circuit board 430. It has been observed that the photodiodes themselves can function as heat generators, leading to thermal drift. In accordance with embodiments, potential thermal gradients caused by operation of the photodiodes can be mitigated by locating the first and second photodiodes 424, 422 on laterally opposite sides of the circuit board 430 so that generated heat is distributed to both photodiodes. Furthermore, the first and second photodiodes 424, 422 may cover a same area on the circuit board 430.

Figure 22B:
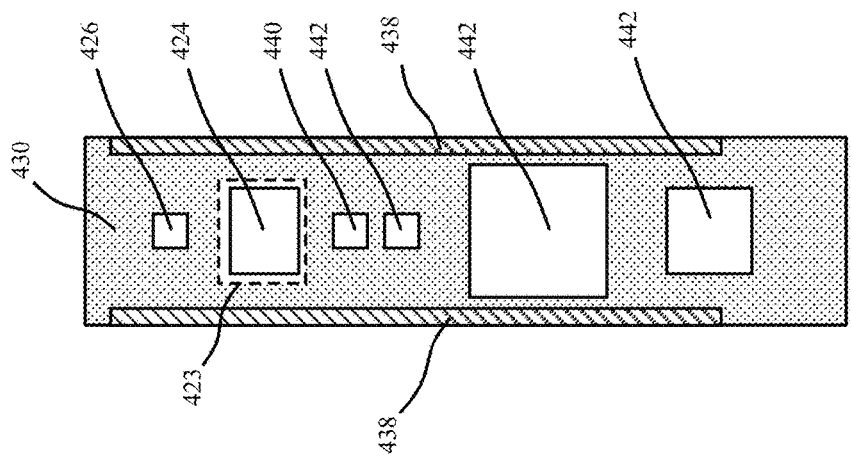
FIG. 22B is schematic top view illustration of a circuit board of a position sensor in accordance in accordance with an embodiment.
Figure 22A:
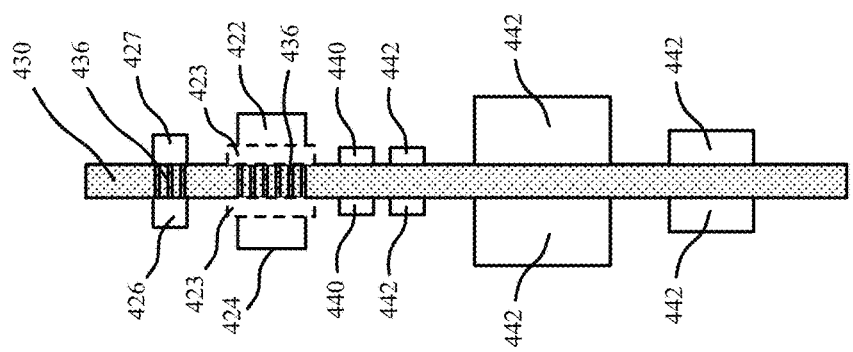
FIG. 22A is cross-sectional side view illustration of a circuit board of a position sensor in accordance in accordance with an embodiment.

FIGS. 22A-22B are schematic cross-sectional side view and top view illustrations of a circuit board 430 in accordance with an embodiment. A shown, a plurality of thermally conductive vias 436, such as metal (e.g. copper) vias, can be located in the circuit board 430 extending between the first and second photodiodes 424, 422. Such thermally conductive vias 436 can help to distribute heat that may be unevenly generated by first and second photodiodes 424, 422 due to different light intensities absorbed by the respective photodiodes during use, as will be explained in further detail below.

The circuit boards 430 may have additional configurations to control or distribute heat. As shown in FIG. 21, the first and second photodiodes 424, 422 may optionally each be mounted on a respective thermoelectric cooler 423 on the circuit board 430 to act as a sink for heat generated by the first and second photodiodes 424, 422, or alternatively to provide uniform temperature substrates (upon which the photodiodes are mounted) during the thermal temperature cycles of the micro device transfer tool. In this manner, the photodiodes exhibit less thermal drift during operation of the tool.

Until this point discussion of thermal matching structures has been made with regard to the first and second photodiodes 424, 422. In accordance with embodiments, the light source 426 may or may not be contained within the housing 450 of the position sensor 400. For example, the light source 426 may be located elsewhere within the micro device transfer tool, or also located on the circuit board 430. In an embodiment, a dummy light source 427 is also located on the opposite side of the circuit board as the light source 426 for thermal matching purposes, and may have the same area, etc. as the light source 426, similarly described above with regard to the photodiodes. This may allow for more equal thermal distribution from the light source 426 toward the photodiodes. The light source 426 and dummy light source 427 may also be optionally mounted on a thermal electric cooler 423. Additionally, thermally conductive vias 436 can be located in the circuit board 430 beneath the light source 426, and the dummy light source 427 may also be operational, similar to the light source 426, only not connected to an optical fiber so that a same amount of heat is generated.

Referring now to FIG. 22B, thermally conductive (e.g. metal) patterns 438 (e.g. strips) may be deposited along edges of the circuit board 430 that are secured to the housing 450. This may mitigate the formation of any thermal hot spots on the circuit board 430 adjacent the first or second photodiodes 424, 422 that could result from conduction of heat from the housing 450 to the circuit board 430. The housing 450 may be formed of an insulating material as well as a thermally conductive material (e.g. metal) to promote even thermal spreading across the position sensor 400.

Additional components may be mounted on the circuit board 430, such as one or more thermistors 440 to measure temperature of the photodiodes, which can be used in an algorithm to compensate thermal drift, or to operate the thermal electric coolers 423. Other components 442 may also be present such as, but not limited to, any of a signal conditioner, amplifier, passive device, etc. A flex circuit 454 may be connected to the circuit board 430, for example at a proximal end, for connection to additional controlling electronics of the micro device transfer tool.

FIG. 23 is an isometric view illustration of a guide tip 452 of a position sensor in accordance in accordance with an embodiment. In particular, FIG. 23 illustrates housing(s) 450 surrounding the respective optical fibers/light guides in which the distal ends 417, 415, 413 of the light source light guide 416, first rigid light guide 414 and the second rigid light guide 412, respectively, are all substantially coplanar with one another at the guide tip 452. The distal end of the housing 450 may also be coplanar, as illustrated. As shown, in an embodiment, the first rigid light guide 414 (and distal end 415) are located laterally between the light source light guide 416 (and distal end 417) and the second rigid light guide 412 (and distal end 413). For example, such an arrangement may be a result of light guide bundling, where discrete light guides, with specified bending angles are integrated. FIG. 24A is a schematic bottom view illustration of a guide tip 452 of a position sensor in accordance with an embodiment. In an embodiment, the first rigid light guide 414 distal end 415 has a smaller area than the second rigid light guide 412 distal end 413. Relative areas may result in relative intensities of light collected by the respective photodiodes 424, 422.

FIG. 24B is a schematic cross-sectional view illustration of a right light guide in accordance with an embodiment. For example, the rigid light guide may correspond to the first rigid light guide 414, or second rigid light guide 412 each of which may have a single core 461 (e.g. extruded glass piece that is transmissive to light) and cladding 462. For example, the core 461 and cladding 462 may both be formed of a glass material, but with different refractive index. The light source light guide 416 may be similarly fabricated with a fiber core 461 and cladding 462.

Referring now to FIG. 24C a schematic cross-sectional side view illustration is provided of a rigid light guide fiber bundle 460 in accordance with an embodiment. For example, the rigid light guide fiber bundle 460 may be characteristic of either the first and second rigid light guides 414, 412, and optionally the light source light guide 416. As shown, the rigid fiber bundle 460 can include a plurality of fibers, each including a fiber core 461 and cladding 462. For example, the fiber core 461 and fiber cladding 462 may both be formed of a glass material, but with a different refractive index. In the illustrated embodiment the fiber claddings 462 are fused together. Thus, each fiber bundle can be fabricated by drawing each fiber, bringing them together to bind/fuse the fiber bundles, followed by imparting any necessary bends followed by cooling, cutting, and polishing. Each fiber bundle may be a close-packed structure.

In accordance with embodiments the optical fibers may be fused together into rigid light guide fiber bundles as illustrated in FIG. 24C for at least two practical purposes, including packaging fine-sized optical fibers together into a rigid and sturdy structure, as well as for the thermal management issues related to the photodiodes. For example, the fibers may be tens of microns or less in diameter, such as less than 10 μm in diameter. Furthermore, in a specific application, the resulting small size of the position sensors 400 allows for multiple position sensors to be packages behind the pivot mount assembly, for example as shown in FIG. 20.

Figure 25A:
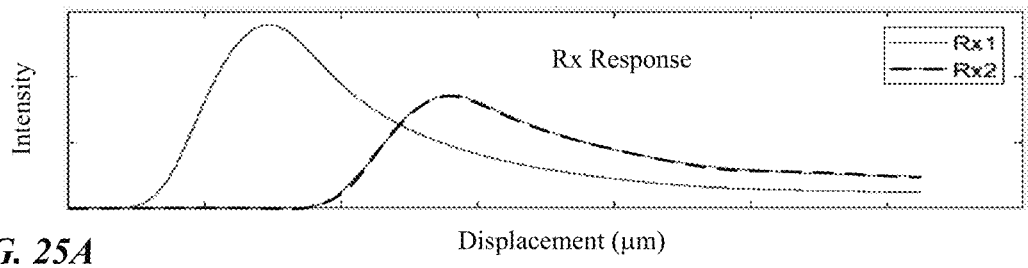
FIG. 25A is a graphical illustration of a light intensity measured by the first and second rigid light guides as a function of displacement in accordance with an embodiment.
Figure 25B:
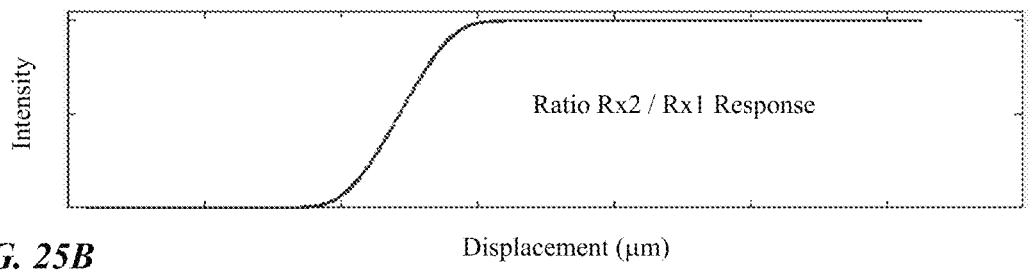
FIG. 25B is a graphical illustration of a ratio of the light intensities measured by the first and second rigid light guides as a function of displacement in accordance with an embodiment.

Referring now to FIGS. 25A-25B graphical illustrations are provided as a method of operating the position sensors 400 in accordance with an embodiment. FIG. 25A is a graphical illustration of a light intensity measured by the first and second rigid light guides as a function of displacement in accordance with an embodiment. FIG. 25B is a graphical illustration of a ratio of the light intensities measured by the first and second rigid light guides as a function of displacement in accordance with an embodiment. As shown, the first rigid light guide 414 and corresponding first photodiode 424 receive a first intensity of light (Rx1) at a certain displacement of the target (e.g. pivot mount assembly) from the position sensor 400. Likewise, the second rigid light guide 412 and corresponding second photodiode 424 receive a second intensity of light (Rx2) the same displacement. In accordance with embodiments the ratio of Rx2Rx1 may be calculated to determine a specified displacement with improved accuracy. As shown in FIG. 24A and FIG. 25A, the relative areas of the rigid light guides may be attributed to the relative intensities at a distance from the light source light guide 416 distal end 417.

Figure 26:
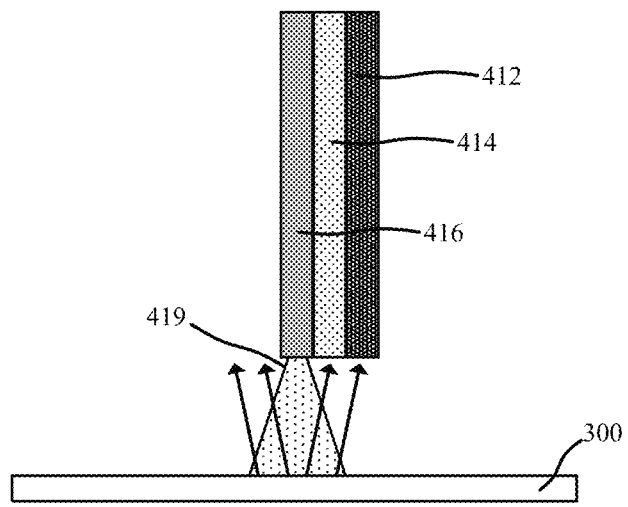
FIG. 26 is a schematic side view illustration of a cone angle generated by position sensor in accordance in accordance with an embodiment.

FIG. 26 is a schematic side view illustration of a cone angle 419 generated by position sensor 400 in accordance in accordance with an embodiment. In accordance with embodiments, the cone angle 419 may be related to the numerical aperture of the optics of the position sensor 400. In the embodiment illustrated in FIG. 26, the linear, side-by-side, relationship of the light source light guide 416, first rigid light guide 414, and second rigid light guide 412 are illustrated. Furthermore, since light is captured in in single x-direction, the area of the second rigid light guide 412 may be increased relative to the first rigid light guide 414.

Figure 27:
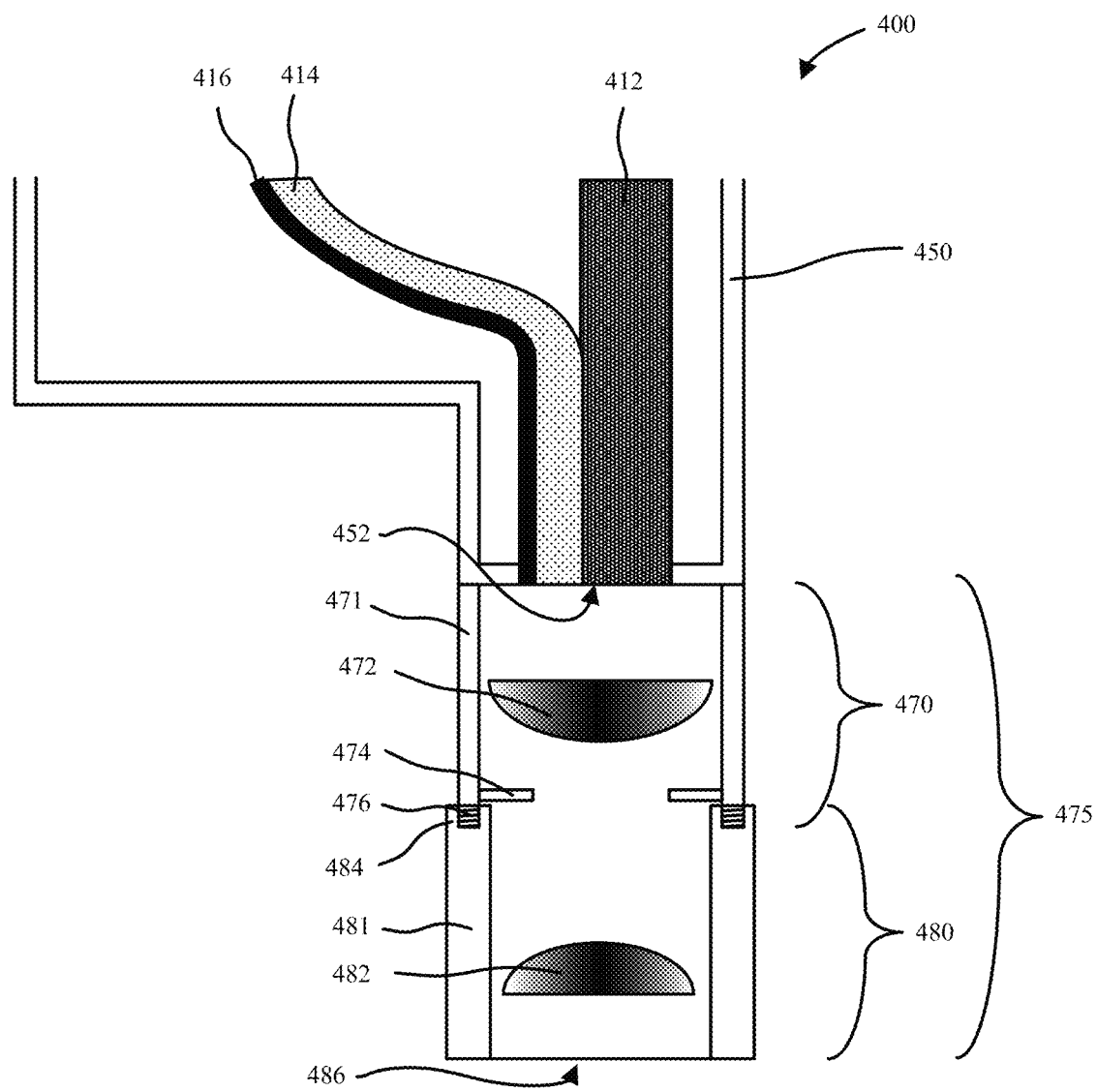
FIG. 27 is a schematic cross-sectional side view illustration of relay optics attached to the guide tip of a position sensor in accordance in accordance with an embodiment.

Referring now to FIG. 27, a schematic cross-sectional side view illustration is provided of relay optics 475 attached to the guide tip 452 of a position sensor 400 in accordance in accordance with an embodiment. For example, the relay optics 475 may control the numerical aperture, working distance, and sensitivity of the position sensor 400. For example, a smaller numerical aperture may be selected for a higher range and lower sensitivity (resolution), while a larger numerical aperture may be selected for a lower range and greater sensitivity (resolution). In accordance with embodiments, similar position sensors with different relay optics 475 may be incorporated throughout the micro device transfer tool, allowing for design uniformity across the tool with flexibility in use.

As illustrated, the relay optics 475 can include a collimator assembly 470 and a focus lens assembly 480 distal to the collimator assembly 470. In an embodiment, the collimator assembly 470 is fixed (e.g. permanently) to the guide tip 452, and the focus lens assembly 480 is releasably attachable to the collimator assembly. For example, this may be accomplished by a pair of male-female threads 476, 484 on the collimator assembly 470 and focus lens assembly 480, respective, or vice versa. In an embodiment the collimator assembly includes a collimator lens 472 contained inside a housing 471 and a pupil stop 474. Pupil stop may optionally be forms as part of the focus lens assembly 480. In an embodiment the focus lens assembly 480 includes a housing 481 and focus lens 482. Focus lens 482 can determine the working length of the relay optics 475. Light exits and enters the relay optics 475 through a distal end 486 of the focus lens assembly 480.

In the above description, position sensors 400 are describes as including rigid light guides 414, 412 arranged with photodiodes for light sensing. Such rigid light guides can contribute to size reduction, reduced measurement times, and reduced drift. However, embodiments described herein may also be practiced with position sensors 400 that do not include rigid light guides. For example, relay optics 475 with a replaceable focus lens assembly 480 can be integrated with light guides that are not rigid.

Figure 28:
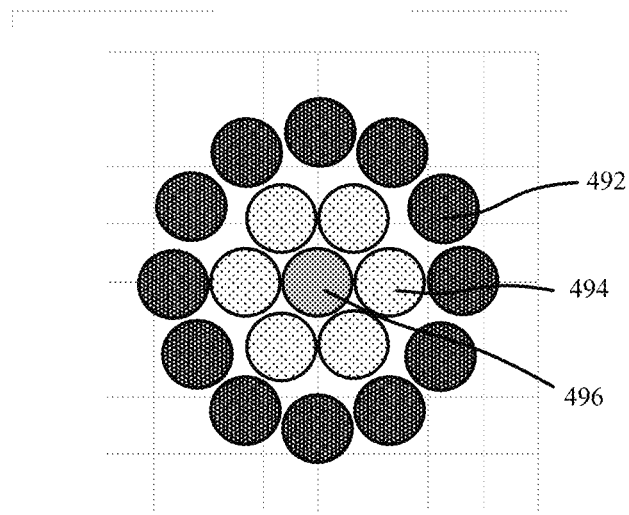
FIG. 28 is a schematic cross-sectional side view illustration of a guide tip of a position sensor in accordance in accordance with an embodiment.
Figure 29:
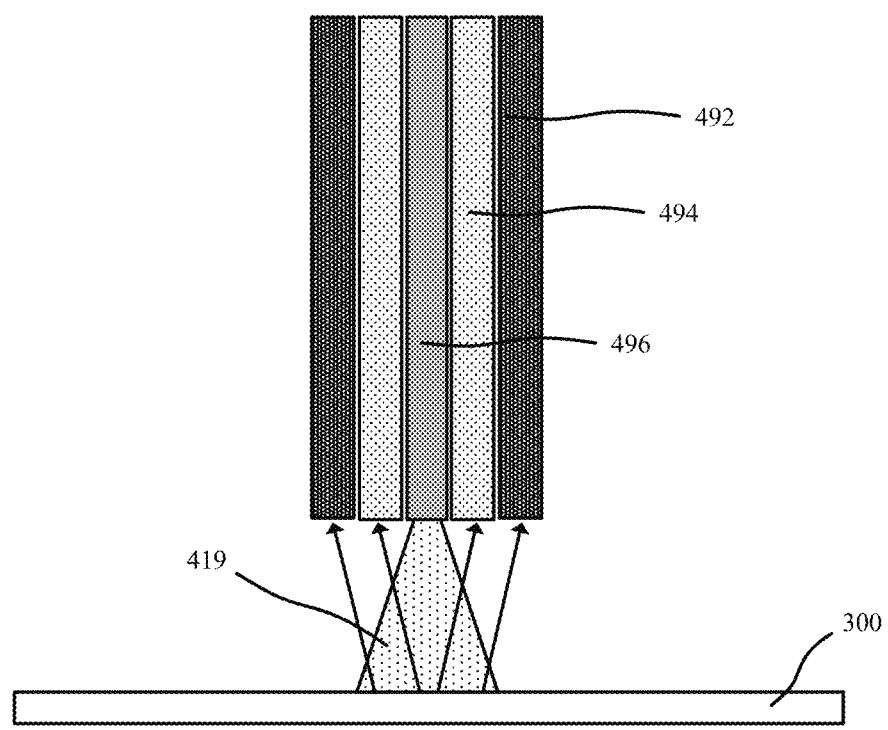
FIG. 29 is a schematic side view illustration of a cone angle generated by position sensor in accordance in accordance with an embodiment.

Referring now to FIGS. 28-29, FIG. 28 is a schematic cross-sectional view illustration of a guide tip of a position sensor in accordance in accordance with another embodiment, while FIG. 29 is a schematic side view illustration of a characteristic cone angle 419 generated by such a position sensor in accordance in accordance with an embodiment. The principle of operation of the position sensor of FIGS. 28-29 remains the same, though with an alternative fiber arrangement. In such an embodiment, the arrangement of optical fibers includes a central fiber 496, a first concentric ring of inner fibers 494 arranged around the central fiber 496, and a second concentric ring of outer fibers 492 arranged around the first concentric ring of inner fibers 494. The concentric rings of fibers may be arranged in close-packed bundle. Similar to the rigid light guide fiber bundle embodiments, proximal ends of the central fiber 496, first concentric ring of inner fibers 494 and second concentric ring of outer fibers 492 can be arranged adjacent to a light source, first photodiode, and second photodiode, respectively. Similarly, measured light intensity or power by the first and second photodiodes will be proportional to the distance between the fibers and a target substrate.

In utilizing the various aspects of the embodiments, it would become apparent to one skilled in the art that combinations or variations of the above embodiments are possible for assembling and operating a micro device transfer tool. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A micro device transfer tool comprising:
   a tip-tilt assembly;
   a piezoelectric stage assembly mounted underneath the tip-tilt assembly;
   a mounting plate underneath the piezoelectric stage assembly; and
   a camera mounted within the piezoelectric stage assembly and extending through an opening in a bottom surface of the mounting plate.

2. The micro device transfer tool of claim 1, wherein the opening is off-centered in the mounting plate.

3. The micro device transfer tool of claim 2, wherein the camera is mounted in a z-flexure assembly of the piezoelectric stage assembly.

4. The micro device transfer tool of claim 3, wherein the piezoelectric stage assembly comprises a plurality of stages nested inside one another.

5. The micro device transfer tool of claim 4, wherein the plurality of stages comprises:
   an x-stage assembly;
   a y-stage assembly; and
   a θz stage assembly.

6. The micro device transfer tool of claim 2, further comprising a center-opening through a center of the mounting plate and a kinetic sensor assembly mounted over the center-opening.

7. The micro device transfer tool of claim 6, further comprising a pivot mount assembly that is releasably attachable with the mounting plate such that the pivot mount assembly spans underneath the center-opening.

8. The micro device transfer tool of claim 6, wherein an exterior-most lens of the camera is located less than one inch from a center of center-opening.

9. The micro device transfer tool of claim 8, wherein the camera has a working distance of greater than 500 µm.

10. The micro device transfer tool of claim 9, wherein the exterior-most lens of the camera is less than 5 mm in diameter.

11. The micro device transfer tool of claim 8, wherein the camera is mounted on a z-adjustment stage, which is independently movable relative to the piezoelectric stage assembly.

12. The micro device transfer tool of claim 11, wherein the z-adjustment stage is motorized.

13. The micro device transfer tool of claim 1, further comprising:
a carrier substrate holder;
a receiving substrate holder; and
an articulating transfer head assembly that is translatable between the carrier substrate holder and the receiving substrate holder, wherein the articulating transfer head assembly comprises:
the tip-tilt assembly;
the piezoelectric stage assembly mounted underneath the tip-tilt assembly;
the mounting plate underneath the piezoelectric stage assembly; and
the camera mounted within the piezoelectric stage assembly and extending through the opening in the bottom surface of the mounting plate.

14. The micro device transfer tool of claim 13, wherein the camera is offset in a direction relative to a center of the mounting plate parallel to an x-translation direction between the carrier substrate holder and the receiving substrate holder.

15. The micro device transfer tool of claim 14, further comprising a second camera mounted within the piezoelectric stage assembly and extending through a second opening in the bottom surface of the mounting plate, wherein the second camera is offset in a second direction relative to the center of the mounting plate orthogonal to the x-translation direction between the carrier substrate holder and the receiving substrate holder.

* * * * *